(12) United States Patent
Wiedmann et al.

(10) Patent No.: US 6,775,312 B2
(45) Date of Patent: Aug. 10, 2004

(54) PHOTONIC INTEGRATED CIRCUIT

(75) Inventors: Joerg Wiedmann, Berlin (DE); Mohammad A. Mazed, Chino Hills, CA (US); Richard Eden, Briarcliff, TX (US)

(73) Assignee: Quantum Devices, Inc., Yorba Linda, CA (US)

(*) Notice: Subject to any disclaimer, the term of this patent is extended or adjusted under 35 U.S.C. 154(b) by 49 days.

(21) Appl. No.: 10/147,381

(22) Filed: May 15, 2002

(65) Prior Publication Data

US 2003/0214991 A1 Nov. 20, 2003

(51) Int. Cl.[7] .................................................. H01S 5/00
(52) U.S. Cl. ............................................................ 372/50
(58) Field of Search .............................. 372/44–46, 50

(56) References Cited

U.S. PATENT DOCUMENTS

| | | | | |
|---|---|---|---|---|
| 4,809,290 A | * | 2/1989 | White et al. | 372/50 |
| 5,003,550 A | * | 3/1991 | Welch et al. | 372/50 |
| 2002/0097765 A1 | * | 7/2002 | Marsh et al. | 372/50 |

* cited by examiner

*Primary Examiner*—Don Wong
*Assistant Examiner*—James A. Menefee
(74) *Attorney, Agent, or Firm*—John W. Eldredge; Myers Dawes Andras & Sherman LLP

(57) ABSTRACT

A photonic integrated circuit has a multi-wavelength laser array and an active waveguide coupler receiving outputs of the laser array. The active waveguide coupler facilitates high output power coupling of the outputs of the laser array to a single mode optical fiber.

61 Claims, 25 Drawing Sheets

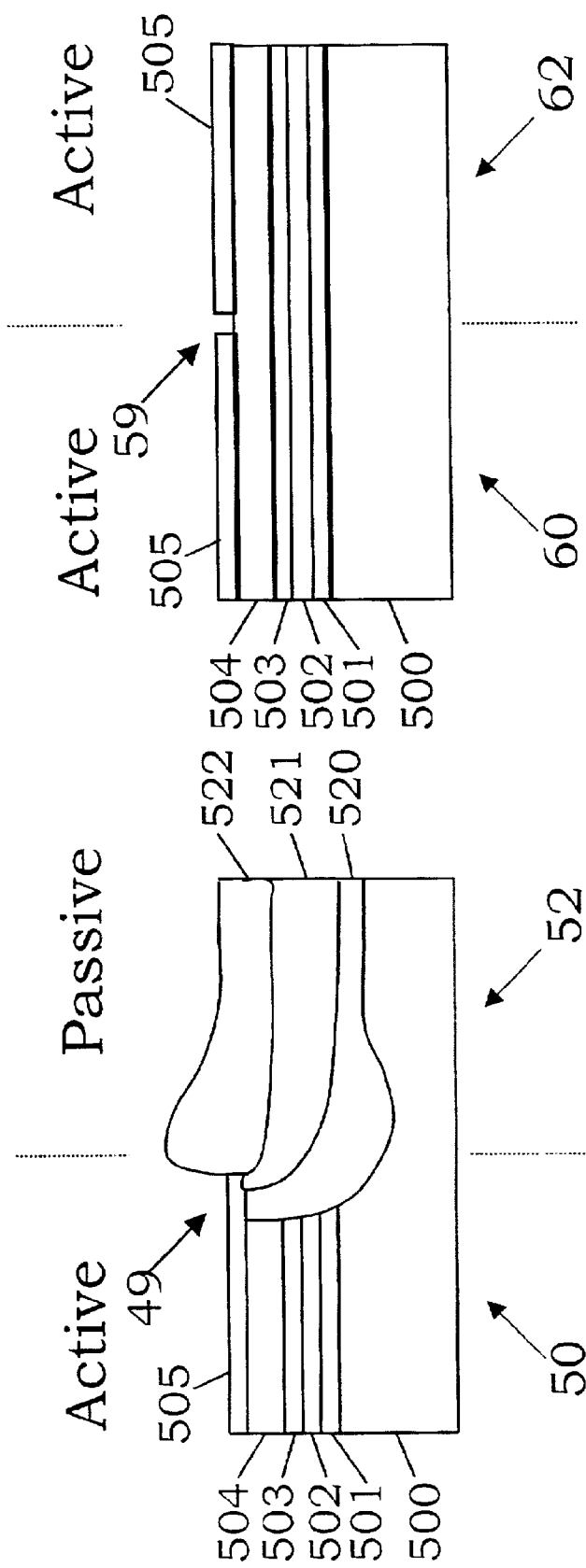

PHOTONIC INTEGRATED CIRCUIT

FIELD OF THE INVENTION

The present invention relates generally to wavelength tunable distributed feedback (DFB) laser arrays, such as those to be used in fiber optic communication systems. The present invention relates more particularly to a photonic integrated circuit (PIC) comprising a DFB laser array and an active waveguide coupler, which facilitates the high power at the output facet.

BACKGROUND OF THE INVENTION

Transmission through fiber optic communication systems is well known. In such fiber optic communication systems, light is modulated with desired information, such as voice, video or data, and is transmitted via optical fibers.

One inherent advantage of such optical fiber communication systems is the ability to transmit large amounts of information over each optical fiber. As the number of users of such systems increases, and as the quantity of data to be transmitted by each user increases, it becomes necessary for the fiber optic communication system to accommodate the transmission of ever-greater quantities of information.

In some instances, it may be cost effective to deploy additional optical fibers, so as to increase the capacity of the fiber optic communication system. However, in many instances, it is extremely expensive to deploy new optical fiber. In these instances, it is preferable to enhance the efficiency of wavelength utilization in order to increase the quantity of information transmitted via a single optical fiber.

In wavelength division multiplexed (WDM) systems, light having a plurality of different wavelengths is used. Each wavelength of single DFB is independently modulated directly or indirectly via modulator, so as to define a channel, which may be used to transmit information independently with respect to all other channels on the same optical fiber.

Thus, in order to provide wavelength redundancy, a tunable or wavelength selectable DFB laser is useful. One such wavelength selectable laser is an array of DFB lasers, the output of which is combined at one output.

Different methods for combining the outputs of active pumped DFB lasers are known. These methods can be broadly classified into discrete combining methods and broad combining methods.

Discrete combining methods select which wavelengths are combined so as to multiplex the outputs of a plurality of lasers utilizing thin-film filters or an arrayed waveguide device. Such wavelength-based couplers are only suitable for combining the outputs of a plurality of lasers when the wavelength of each laser is substantially fixed.

When the wavelengths to be combined onto a single optical fiber are variable, e.g., are not substantially fixed, predefined wavelengths, then a power based wavelength coupler must be utilized. In a power based wavelength coupler where the outputs of a plurality of lasers are added to one another in more of a brute force manner.

One example of a power based wavelength coupler is a Y-coupler, wherein passive waveguides are used to combine the outputs of DFB lasers, each having a different output wavelength, into a single composite beam. Such Y-couplers merely comprise waveguides which come together in a Y configuration, such that the two light beams transmitted therethrough are forced together. Any desired number (subject to transmission and coupling losses) of such Y-couplers may be used so as to facilitate the combining of any desired number of laser outputs.

Such contemporary Y-couplers contain only passive material, and thus, cause several inherent problems, as discussed in detail below.

An improvement to the basic Y-coupler is the contemporary multimode interference (MMI) coupler. The multimode interference (MMI) coupler, like the Y-coupler, is a passive power coupler. However, the multimode interference (MMI) coupler has the advantage of smaller size and better uniformity of output power across the entire range of wavelengths accommodated thereby.

Typically, an actively pumped semiconductor optical amplifier (SOA) waveguide is provided after the power based wavelength coupler (whether it is Y or MMI coupler). The actively pumped SOA waveguide tends to compensate for power losses inherently introduced by these power based wavelength coupler.

However, disadvantages commonly associated with the use of such power based wavelength couplers is the alignment of the passive unpumped coupler with the active pumped DFB lasers and active pumped SOA waveguide. Thus, substantial processing and yield problems, particularly with respect to integration of the active and passive components, occur according to contemporary methodology.

Additionally, the passive region of such contemporary devices is unpumped and thus requires the use of a very low absorption loss material. Therefore, the vertical structure of the passive region cannot be the same as the vertical structure of the DFB laser and SOA waveguide. This introduces the additional disadvantage that fabrication of such a contemporary active-passive-active device requires two distinctly different growth processes, as well as an undesirably large number of lithography and etching steps. Moreover, the use of such growth processes and such lithography and etching process steps undesirably complicates and increases the cost of fabricating such contemporary devices.

A further disadvantage of such contemporary devices involves the interface between the active and passive regions thereof. Optimization of this interface, so as to achieve suitably low coupling loss and good alignment, is very difficult. Even the best interfaces achieved according to contemporary methodology lead to a small refractive index difference and therefore inherently cause unwanted reflections that degrade DFB lasers' performance.

In view of the foregoing, it would be beneficial to provide a PIC which facilitates transmission of laser outputs from a DFB laser array, through a coupler, to a single mode optic fiber, in a manner which does not have the alignment, coupling, processing and yield problems associated with active region and passive region integration that are present according to contemporary practice.

SUMMARY OF THE INVENTION

The present invention specifically addresses and alleviates the above-mentioned deficiencies associated with the prior art. More particularly, the present invention comprises a PIC comprising a DFB laser array and an active waveguide coupler, which receives outputs from the DFB laser array. The active waveguide coupler facilitates high output coupling of the outputs of the DFB laser array to a single mode optical fiber, optionally with enhanced linewidth and noise characteristics. The fabrication process of the present invention decreases processing complexity and enhances yield.

These, as well as other advantages of the present invention, will be more apparent from the following description and drawings. It is understood that changes in the specific structure shown and described may be made within the scope of the claims without departing from the spirit of the invention.

BRIEF DESCRIPTION OF THE DRAWINGS

The present invention will be more fully understood when considered with respect to the following detailed description, appended claims, and accompanying drawings, wherein:

FIG. 3 is a semi-schematic cross-sectional view of an interface between an active region and a passive region (such as between a DFB laser and a coupler according to contemporary practice) showing the discontinuity there between;

FIG. 4 is a semi-schematic cross-sectional view showing the lack of a major refractive index discontinuity between two active sections, such as between a DFB laser and a coupler according to the present invention;

DETAILED DESCRIPTION OF THE INVENTION

The detailed description set forth below in connection with the appended drawings is intended as a description of the presently preferred embodiments of the invention and is not intended to represent the only forms in which the invention may be constructed or utilized. The description sets forth the functions of the invention and the sequence of steps for constructing and operating the invention in connection with the illustrated embodiments. It is to be understood, however, that the same or equivalent functions and sequences may be accomplished by different embodiments that are also intended to be encompassed within the spirit and scope of this invention.

Figure 1:
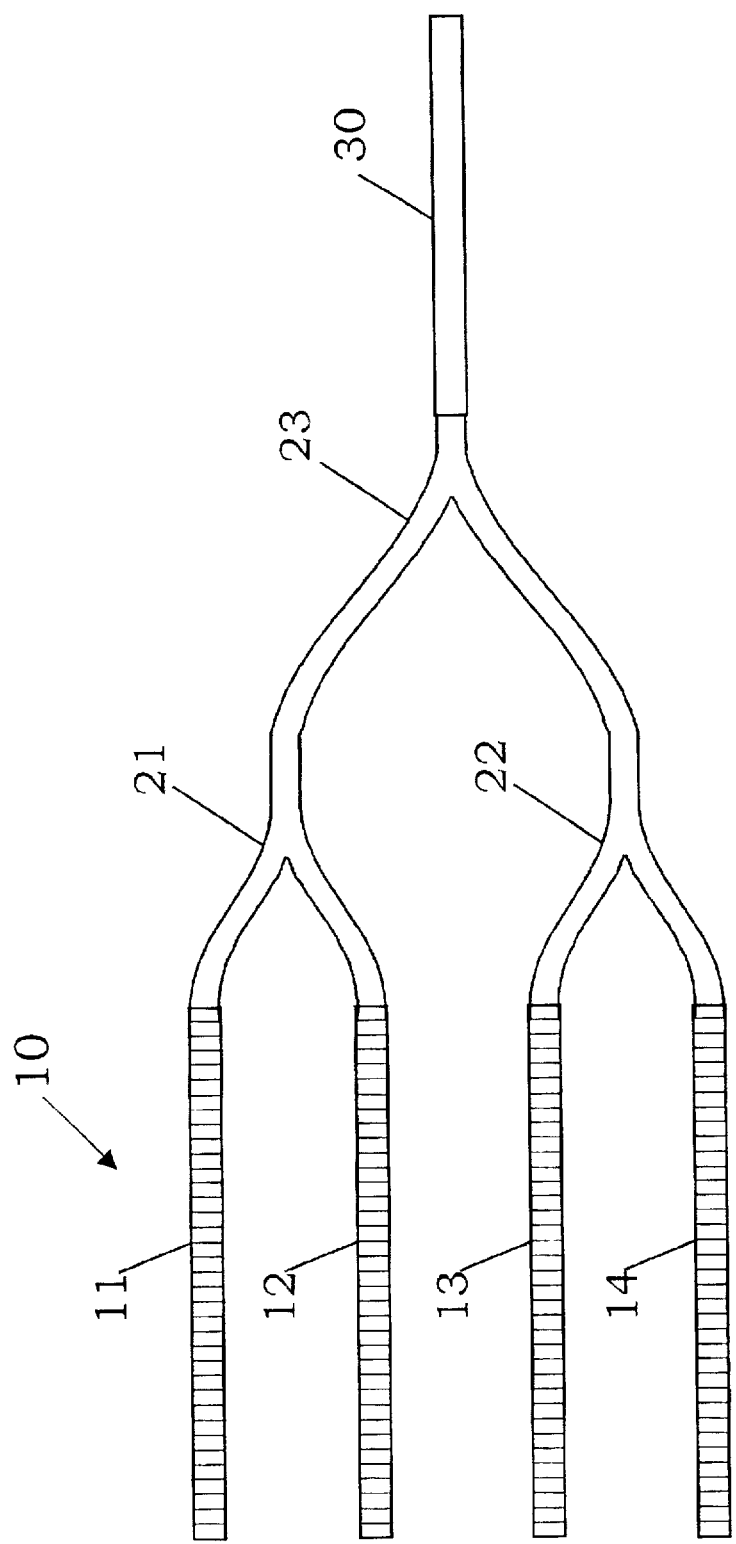
FIG. 1 is a semi-schematic representation of a four distributed feedback (DFB) laser array utilizing three passive Y-couplers as a passive power coupler to provide a composite output to a SOA waveguide according to contemporary practice.

Referring now to FIG. 1, according to one contemporary method for combining outputs of a DFB laser array so as to provide the combined or composite light beam to a single mode optical fiber, Y-couplers 21–23 are used.

More particularly, a DFB laser array 10 comprises a plurality of individual tunable DFB lasers 11–14. As discussed below, tunable distributed Bragg reflector (DBR) lasers may alternatively be used. According to the examples illustrated in FIGS. 1, 2 and 5–7, the DFB laser array 10 comprises a first 11, second 12, third 13 and fourth 14 individual DFB lasers. Those skilled in the art will appreciate that any desired number of DFB lasers may similarly be used (subject to real-estate, power and other design and market constraints).

Referring again to FIG. 1, three Y-couplers 21–23 are used to combine the outputs of the first 11, second 12, third 13 and fourth 14 DFB lasers into a single composite laser beam. More particularly, first Y-coupler 21 combines the outputs of the first 11 and second 12 DFB lasers and second Y-coupler 22 similarly combines the outputs of the third 13 and fourth 14 DFB lasers. Third Y-coupler 23 then combines the outputs of the first Y-coupler 21 and second Y-coupler 22. Typically, the output of the third Y-coupler 23 is provided to SOA waveguide 30, which may have a gain, for example, which at least partially compensates for the inherent attenuation associated with the first 21, second 22, and third 23 Y-couplers. As those skilled in the art will appreciate, such Y-couplers typically have a loss of a minimum of 6 dB (3 dB per Y-branch or 6 dB totally).

According to contemporary practice, only the lasers 11–14 of the DFB laser array 10 and SOA waveguide 30 shown in FIG. 1 are active. The first 21, second 22, and third 23 Y-couplers are each formed so as to be passive, i.e., so as not to provide any gain to the optical signal transmitted therethrough.

In an attempt to decrease the size of such PIC and to increase the uniformity of the output power thereof across the entire range of wavelengths provided by such a device, an MMI coupler rather than Y-couplers, may be utilized.

Figure 2:
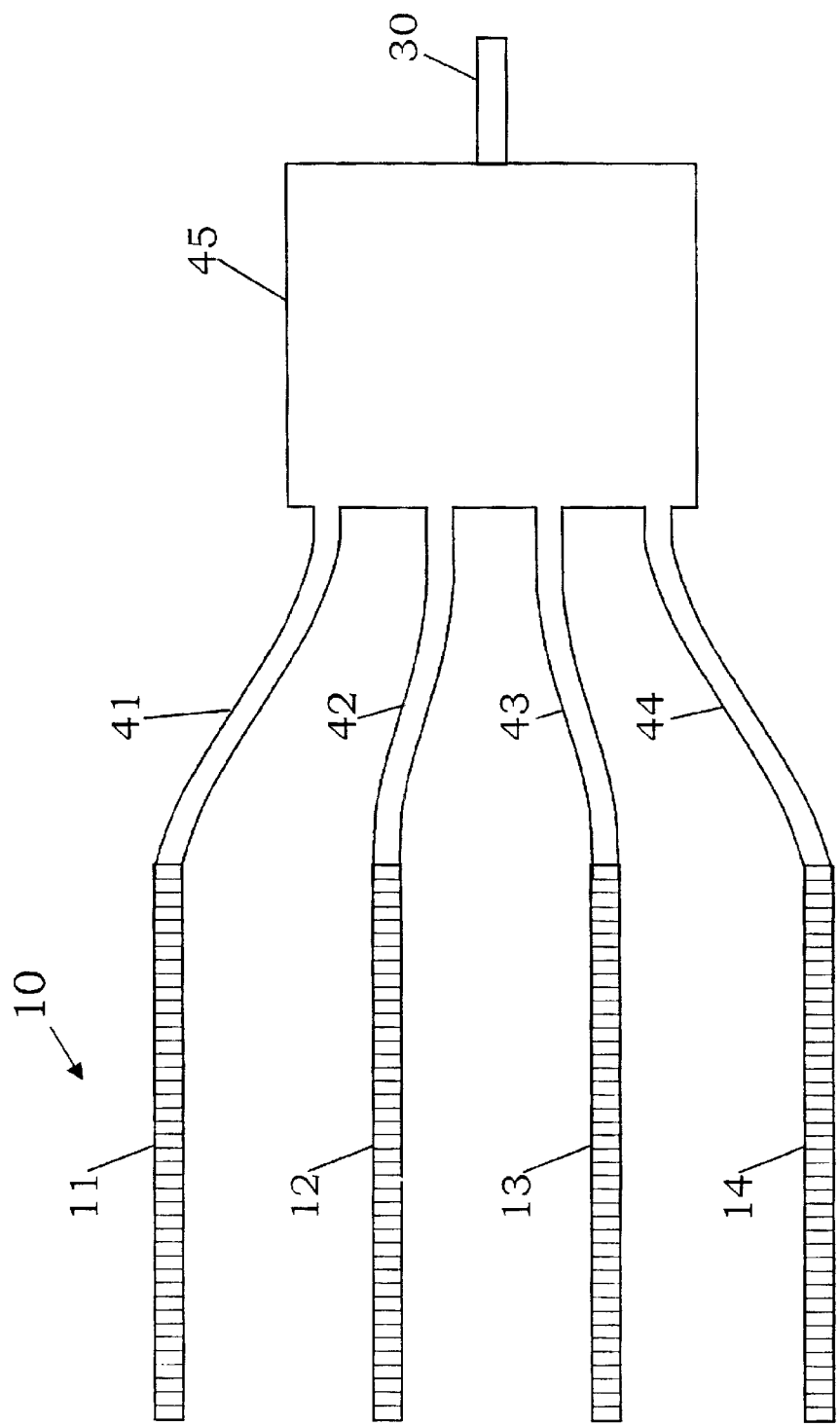
FIG. 2 is a semi-schematic representation of a four DFB laser array utilizing S-bends and a passive MMI power coupler to provide a combined output to a SOA waveguide according to contemporary practice.

Referring now to FIG. 2, the lasers 11–14 of the DFB laser array 10 provide their outputs to S-curves 41–44, which direct the outputs of the DFB lasers 11–14 to the MMI coupler 45. The output of MMI coupler 45 is typically provided to SOA waveguide 30, as discussed above the S-Bend is only needed if the spacing of the laser and the spacing at the input of the MMI is different. An MMI design without S-Bend is also possible (see FIG. 10).

According to contemporary practice, only the individual DFB lasers 11–14 of the DFB laser array 10 and SOA waveguide 30, shown in FIG. 2, are active. The S-curves 41–44 and the MMI coupler 45 are formed of passive material.

Referring now to FIG. 3, the fabrication of a PIC having both active and passive sections, such as the contemporary devices of FIGS. 1 and 2, suffer from substantial misalignment, additional material growth, and processing yield issues which detract from their overall effectiveness and which increase chip cost undesirably. More particularly, the interface 49 of an active region 50 with a passive region 52, inherently creates discontinuities which tend to reflect light being transmitted from the active region to the passive region, and vise versa, back toward the source of such light. Such reflections are due to inherent differences in the index of refraction between the active region and the passive region. Thus, the interface 49 causes undesirable coupling losses. Further, such reflected light tends to interfere with the operation of the DFB lasers 11–14 of the DFB laser array 10, thus degrading the performance thereof.

In order to form the passive region 52, one additional growth for forming the layers 520–522 and a large number of lithography and etching process steps are required. Layers 520–522 can be made of InGaAsP material with its bandgap large enough as to form a low absorbing waveguide where the upper InGaAsP layer 522 has the smallest bandgap and the lower InGaAsP layer 520 has the largest bandgap. The use of such processes undesirably increases the cost of contemporary PIC.

As shown in FIGS. 3 and 4, the layers and other structures are defined as follows:

Interface 49 is the interface between the active region and the passive region, the active region 50 is the active waveguide structure (such as a laser or SOA, according to contemporary practice), the passive region 52 is the passive waveguide structure (such as a combiner, according to contemporary practice), layer 500 is the InP substrate, layer 501 is the InGaAsP lower optical confinement layer (OCL), layer 502 is the active region consisting of multiple quantum wells (MQW), layer 503 is the InGaAsP upper optical confinement layer (OCL), layer 504 is a InP layer, layer 505 is metal contact layer, layers 520–522 are InGaAsP having different composition ratios in order to achieve a different bandgap, layer 520 is InGaAsP (the largest bandgap), layer 521 is InGaAsP layer 522 is InGaAsP (the smallest bandgap), item 59 is the separation between the two metal contacts 505, active region 60 is the active waveguide structure (the laser, SOA or combiner, according to the present inventions), and active region 62 is a different active waveguide (the laser, SOA or combiner, according the present invention).

A typical active region for a laser or SOA consists of the layers 500–504 with a metal contact 505 on top for current injection. Starting from the bottom, the vertical layer structure consists of the InP substrate 500, next the InGaAsP lower optical confinement layer 501, the active layer 502 and the InGaAsP upper optical confinement layer 503. An InP layer 504 completes the vertical structure. Even though the whole structure forms a waveguide, the main function of the optical confinement layers 501 and 503 is to confine the light to as much as possible to the active layer 502 which can be also called the core of the waveguide. The active layer 502 itself consists of several multiple quantum wells (MQW) which are well know to improve the gain characteristics.

Referring now to FIG. 4, according to the present invention, an interface 59 between two active regions 60 and 62, does not create such large undesirable reflections. The reflections caused by the interface 59 are negligibly small, since gross discontinuities due to differences in index of refraction are not present (only very small discontinuities due to the separation of the electrodes are present). The very thin highly doped contact layer (not shown in the drawing) between the upper InP 504 and the metal contact needs also to be separated by a simple etching step. That is, active region 60 and active region 62 are formed of layers which are fabricated contemporaneously, i.e. during common processing steps, so as to mitigate or altogether eliminate such discontinuities. Thus, the coupling losses and the consequent degradation in performance of the lasers 11–14 of the DFB laser array 10 associated with the contemporary active-to-passive interface 49 of FIG. 3 tend to be eliminated altogether. The vertical structure 500–504 of the active waveguide is therefore now substantially the same as that of the laser or the SOA.

Further, since all of the active regions are formed contemporaneously, the need for two distinctly different growths and for a large number of lithography and etching processes is eliminated, thereby substantially reducing the cost of a PIC formed according to the present invention.

Figure 5:
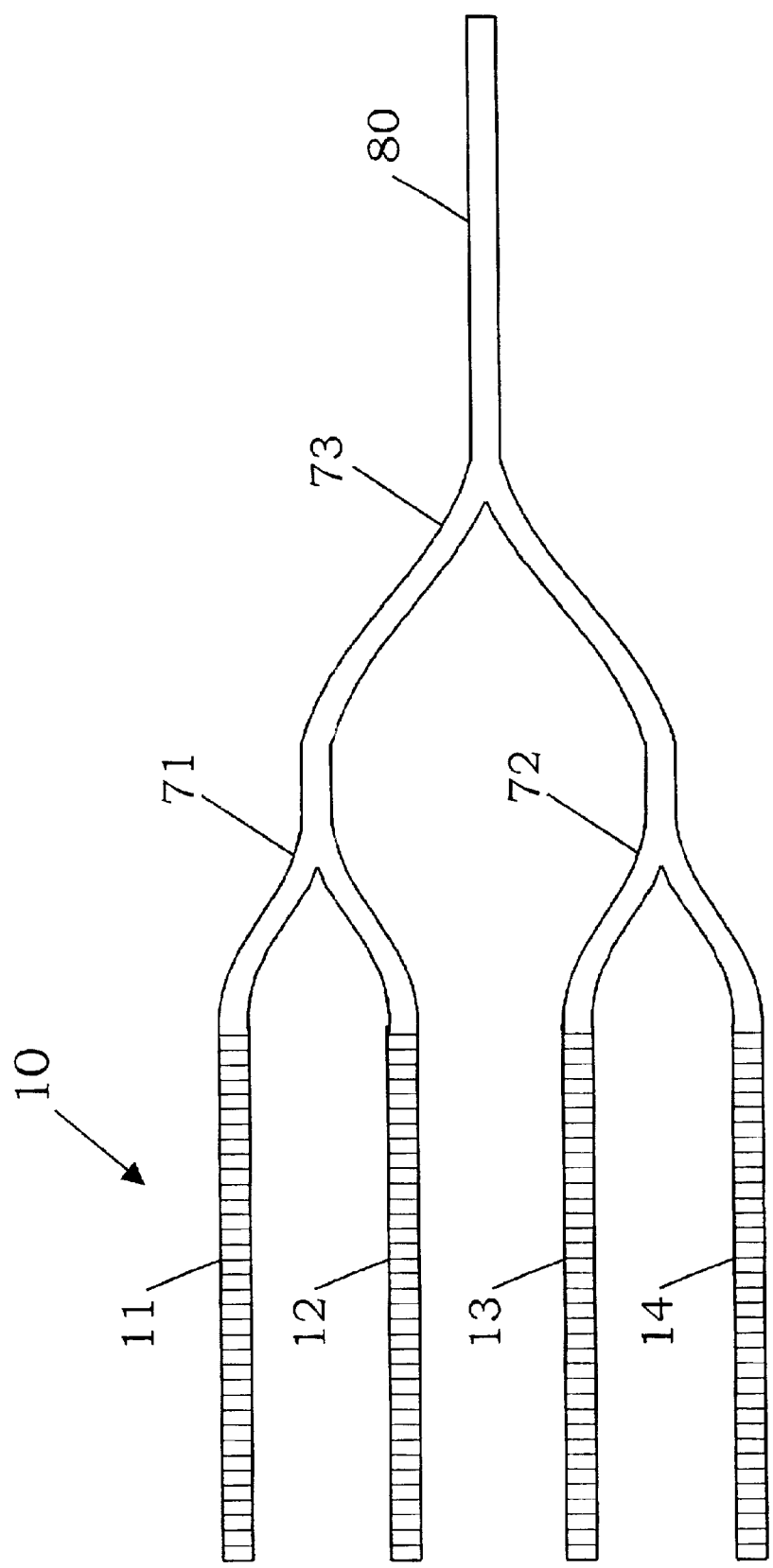
FIG. 5 is a semi-schematic representation of a first embodiment of a PIC of the present invention, wherein a laser array comprised of four DFB lasers uses three active Y-couplers as an active power coupler to provide a combined laser output to SOA waveguide, wherein the entire device is active, but has separate electrodes.

As shown in FIG. 5, one embodiment of the present invention takes advantage of the use of active-to-active interfaces, such as those shown in FIG. 4, rather than utilizing contemporary active-topassive interfaces, such as those shown in FIG. 3. Thus, the lasers 11–14 of the laser array 10 shown in FIG. 5 provide output to active Y-couplers (71–73), which in turn provide an output to a SOA waveguide 80 (which is inherently active). Since the lasers 11–14, the Y-couplers, and SOA waveguide 80 are all formed of active material, no active-to-passive interfaces are used.

More particularly, the first 11 and second 12 DFB lasers provide outputs to the first active Y-coupler 71. Similarly, the third 13 and fourth 14 DFB lasers provide outputs to the second active Y-coupler 72. The first active Y-coupler 71 and the second active Y-coupler 72 provide outputs to the third active Y-coupler 73. Preferably the third active Y-coupler 73 provides an output to the SOA waveguide 80.

It is important to appreciate that there are no substantial regions of passive material shown in FIG. 5 and that there are consequently no active-to-passive interfaces, such as that of FIG. 3.

Figure 6:
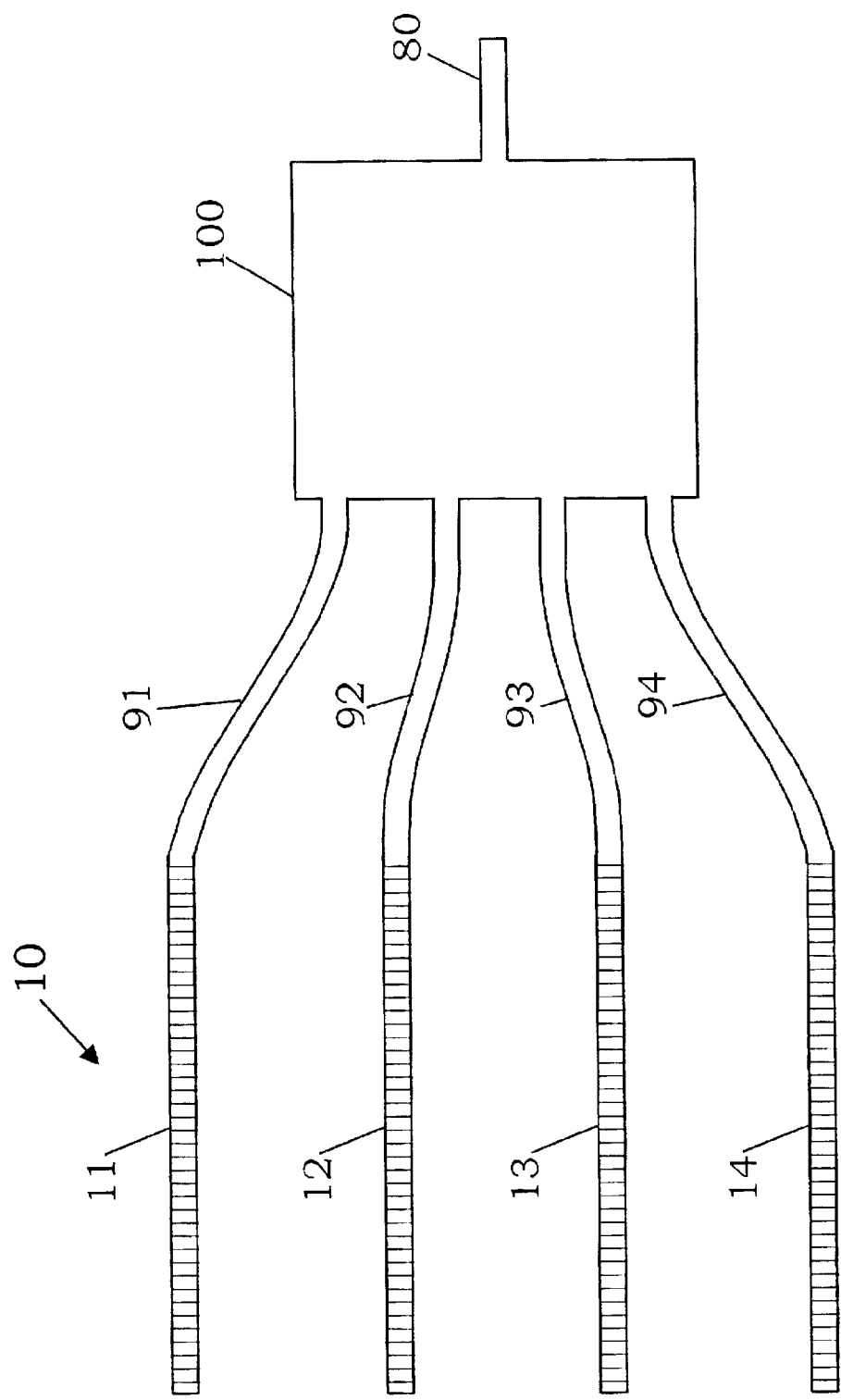
FIG. 6 is a semi-schematic representation of a second embodiment of a PIC of the present invention, wherein a laser array comprised of four DFB lasers uses MMI coupler to provide a combined laser output to a SOA waveguide, wherein the entire device is active, but has separate electrodes.

Referring now to FIG. 6, another embodiment of the present invention utilizes an active MMI coupler 100 rather than a plurality of active Y-couplers, such as those shown in FIG. 5.

More particularly, the lasers 11–14 of DFB laser array 10 each provide an output to active S-curves 91–94. Each active S-curve 91–94 provides an output to active MMI coupler 100. The active MMI coupler 100 preferably provides an output to SOA waveguide 80. As mentioned above, the S-curves are optional, depending on the spacing between the layers 11–14 and the spacing at the input of the MMI coupler 100. One important consideration is that any interconnections (such as the S-curves 91–94) are formed of active material.

It is worthwhile to appreciate that the PIC shown in FIG. 6 does not contain any substantial regions of passive material and that no active-to-passive interfaces such as that of FIG. 3 are formed.

The MMI coupler 100 of FIG. 6 is optionally pumped substantially over the entire active region thereof. In this manner, maximum gain may be obtained. Alternatively, MMI coupler 100 or any other active region of the photonic integrated circuit of the present invention may be pumped only at selected portions thereof, as discussed below.

Figure 7:
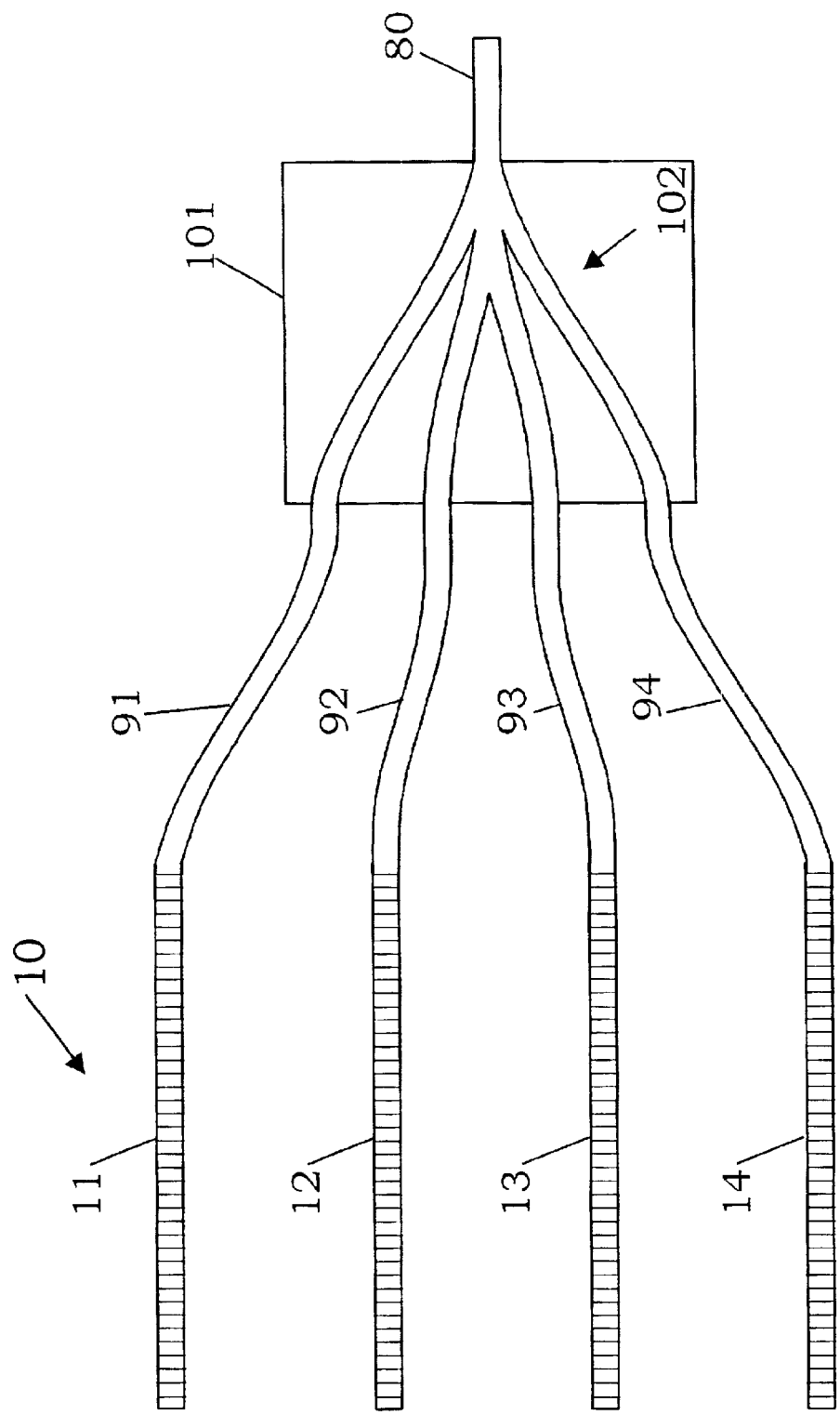
FIG. 7 is a semi-schematic representation of a third embodiment of PIC of the present invention, wherein a laser array comprised of four DFB lasers uses an active MMI coupler to provide a combined laser output to a SOA waveguide, wherein MMI coupler is only pumped at selected locations, e.g., the location of maximum light intensity therein.

Referring now to FIG. 7, another embodiment of the present invention has an MMI coupler 101, which is pumped only partially. That is, the electrodes of the MMI coupler 101 are configured so as to only pump the active material of the MMI coupler 101 at certain locations, e.g., at the locations therein of maximum light intensity.

Those skilled in the art will appreciate that pumping or current injection can occur at various different portions of an active device. The gain, the pumping current (including any leakage current) and the heat load can be controlled to some degree by pumping only selected portions of an active device.

As shown in FIG. 7, only a portion of MMI coupler 101 is pumped so as to substantially reduce the total current and heat load associated with pumping of MMI coupler 101, while still providing a desired gain. Typically, the pumped region will be similar to junction 102 of the four light beams within the MMI coupler 101.

As those skilled in the art will further appreciate, any portion of the photonic integrated circuits of the present invention may be pumped or not pumped, as desired, so as to provide the desired gain, pumping current (including leakage) and/or heat load. Whether a portion of the photonic integrated circuit of the present invention is pumped or not, that portion is formed of active material (as shown in FIG. 4), so as to eliminate active-to-passive interfaces (as shown in FIG. 3), and the undesirable effects and costs associated therewith.

The various embodiments of the photonic integrated circuit of the present invention are preferably formed utilizing DFB lasers formed on a monolithic DFB laser chip utilizing multiple DFB laser diodes, wherein each individual DFB laser diode has a pre-determined range of emission wavelengths which provides tunability or selectivity of the output wavelength thereof.

However, those skilled in the art will appreciate that the PIC of the present invention may alternatively be formed utilizing various other types of DFB lasers formed upon various other types of substrates. Further, the PIC of the present invention is suitable for use with fixed output wavelength DFB lasers and is also suitable for use with tunable output wavelength DFB lasers wherein each individual DFB laser of the laser array has a substantially identical output wavelength range. Indeed, as discussed below, the present invention may alternatively utilize other types of lasers, such as DBR lasers.

According to the present invention, the outputs of the individual DFB lasers of the DFB laser array are combined utilizing an active waveguide coupler to achieve high power output at the facet. As discussed above, the use of a coupler is a better solution for varying wavelengths.

By utilizing individual DFB lasers, wherein each individual DFB laser has a different, predetermined range of emission wavelengths (wherein the wavelength ranges may or may not overlap among individual lasers) a DFB laser array having a large cumulative tuning range could be provided.

By mitigating the occurrence of passive regions, undesirable reflections and optical losses are consequently mitigated so as to provide high power output while maintaining desirable optical characteristics of the composite signal.

Further, by eliminating passive regions of the PIC of the present invention, a complete material regrowth step, which would otherwise be necessary for the formation of such passive regions, is eliminated. The problems inherently associated with alignment, coupling, processing and yield when passive regions are utilized, are eliminated. That is, since an identical vertical structure for all portions of the photonic integrated circuit of the present invention is utilized, processing is simplified and yield is substantially enhanced.

Figure 8:
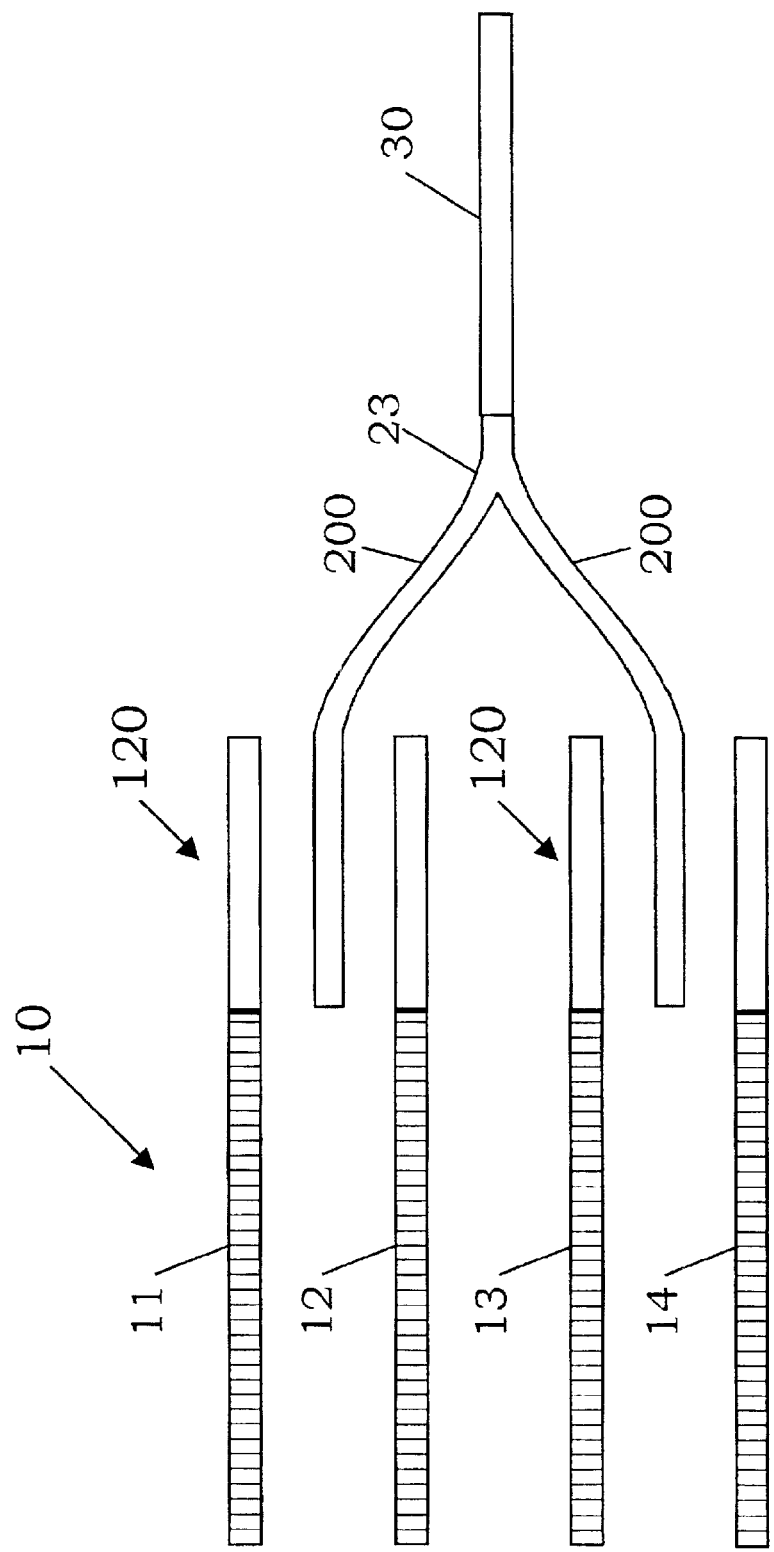
FIG. 8 is a semi-schematic representation of a four DFB laser array utilizing passive directional couplers and a passive Y-coupler as a passive power coupler to provide a composite output to a SOA waveguide according to contemporary practices.

Referring now to FIG. 8, a contemporary four DFB laser array 10 comprises individual lasers 11, 12, 13, and 14. The individual lasers 11–14 are coupled via passive directional couplers 120 to passive S-bends 200. Passive S-bends 200 transmit light from the directional couplers 120 to a passive Y-coupler 23 to provide a combined output to active SOA waveguide 30.

The directional couplers 120, the S-bends 200 and the Y-coupler 23 are all formed of passive material, according to contemporary practice. Thus, an active-passive-active structure is formed, which suffers from the inherent differences discussed above.

Figure 9:
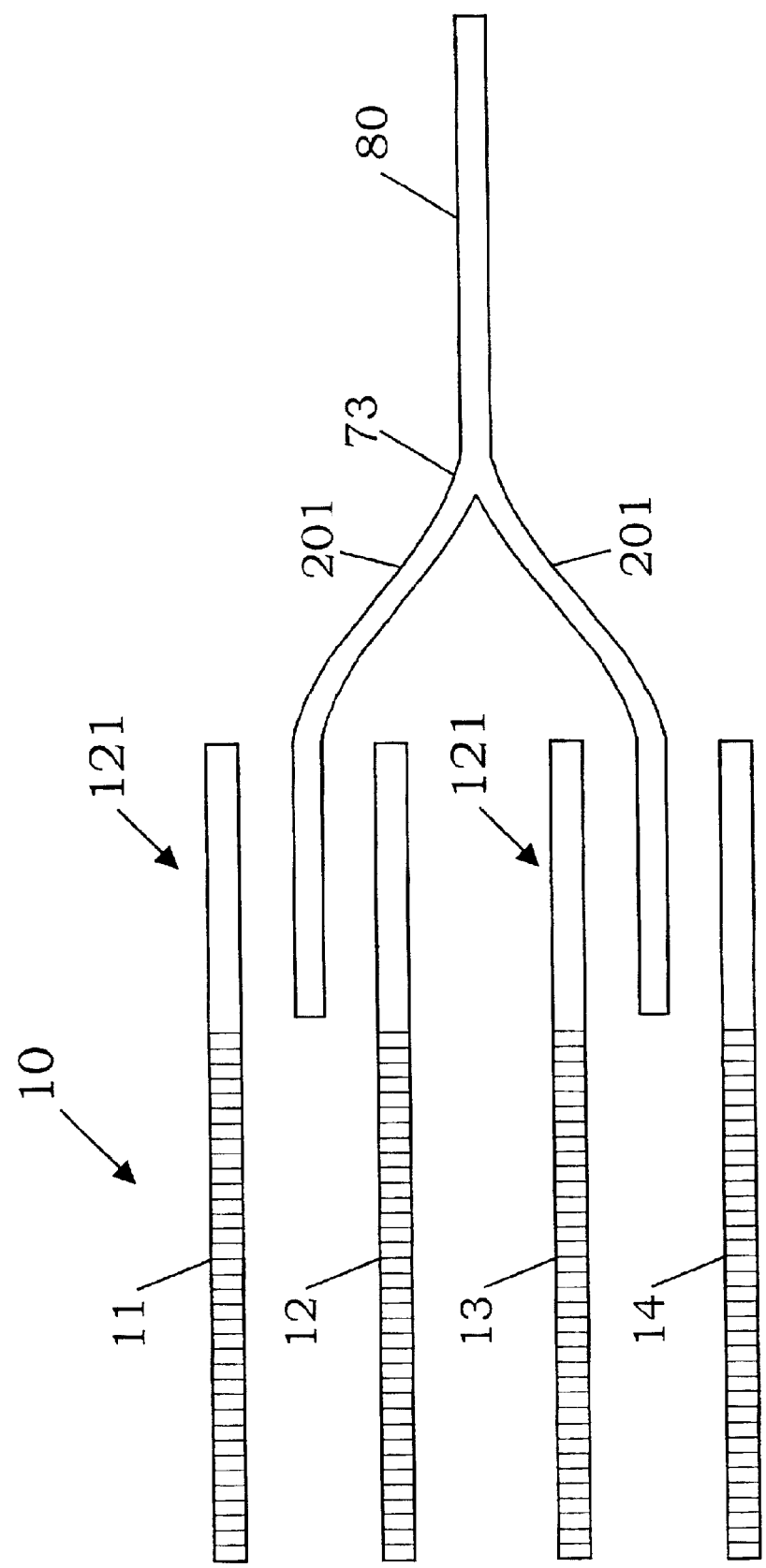
FIG. 9 is semi-schematic representation of a fourth embodiment of a PIC of the present invention, wherein a laser array comprise of four DFB lasers uses an active directional coupler and an active Y-coupler to provide a combined laser output to a SOA waveguide.

Referring now to FIG. 9, according to the present invention the individual lasers 11–14 of the laser array 10 provide light to active directional couplers 121. Light from the active directional couplers is transmitted via active S-bends 201 to active Y-coupler 73. Light from the active Y-coupler 73 is transmitted to active SOA waveguide 80. Thus, according to this embodiment of the present invention, light is communicated from the individual lasers of 11–14 to the SOA waveguide 80 via only active components.

Figure 10:
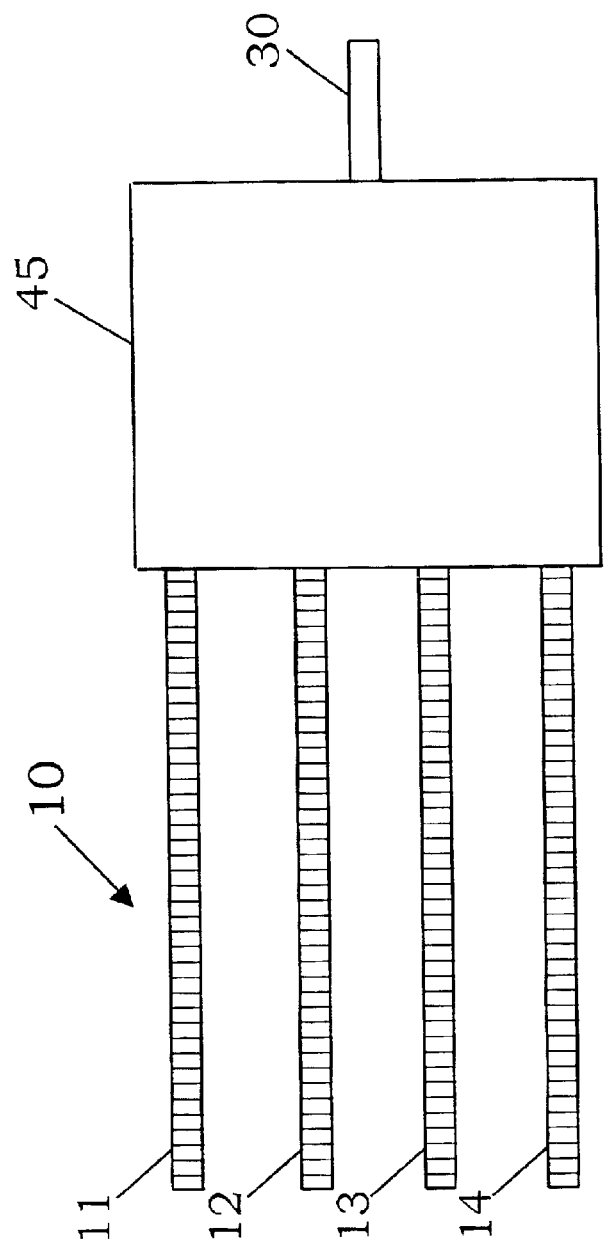
FIG. 10 is a semi-schematic representation of a four DFB laser array utilizing a single passive MMI to provide a combined output to a SOA waveguide according to contemporary practice.

Referring now to FIG. 10, according to contemporary practice individual lasers 11–14 of the laser array 10 can alternatively be configured so as to communicate light directly (without the use of S-curves or the like) into a passive MMI coupler 45. The combined light output from the MMI coupler 45 is communicated to active SOA 30. This active-passive-active configuration suffers from the inherent deficiencies discussed above.

Figure 11:
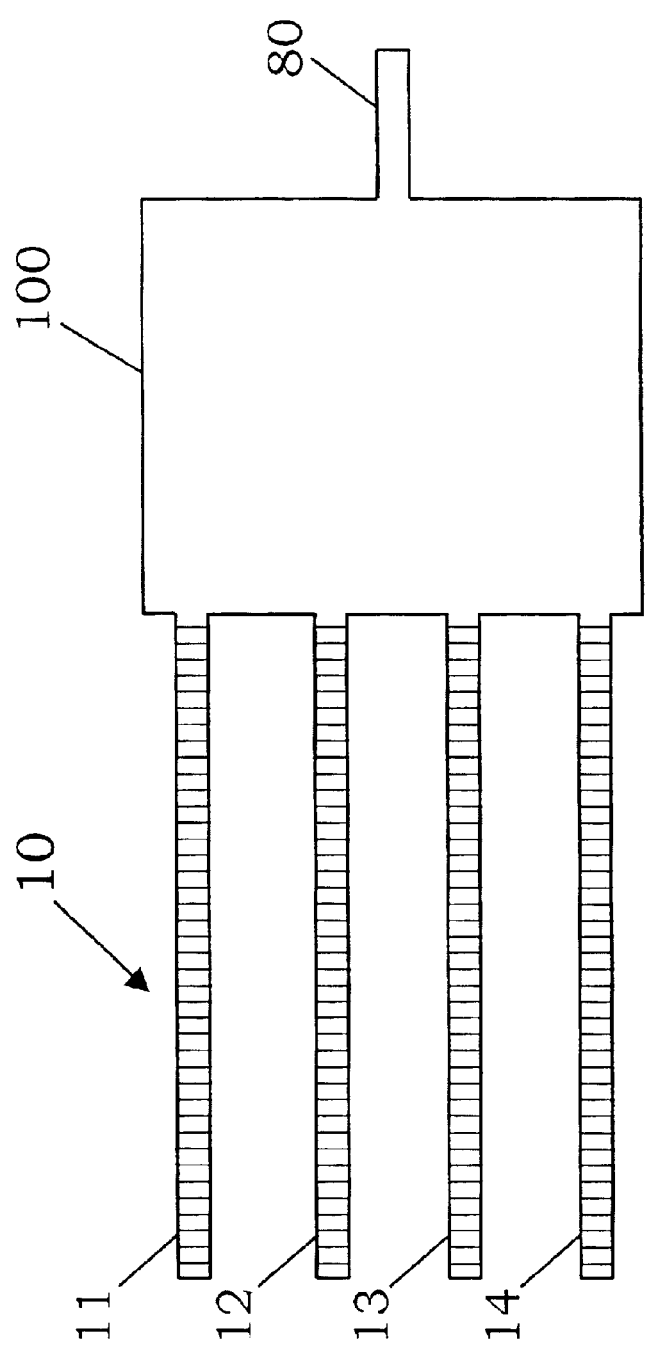
FIG. 11 is a semi-schematic representation of a fifth embodiment of a PIC of the present invention, wherein a laser array comprised of four DFB lasers communicates light to an active MMI without using S-bends and the MMI provides a combined laser output to a SOA waveguide.

Referring now to FIG. 11, according to the present invention the individual lasers 11–14 of laser array 10 communicate light directly, i.e., without S-bends, into an active MMI coupler 100. Light from the active MMI coupler 100 is communicated to active SOA waveguide 80. In this manner, light from the laser array 10 is communicated to the SOA waveguide 80 using only active components, thus realizing the above discussed benefits. Separate electrodes can optionally be utilized so as to define those portions of the active material which are to be pumped.

Figure 12:
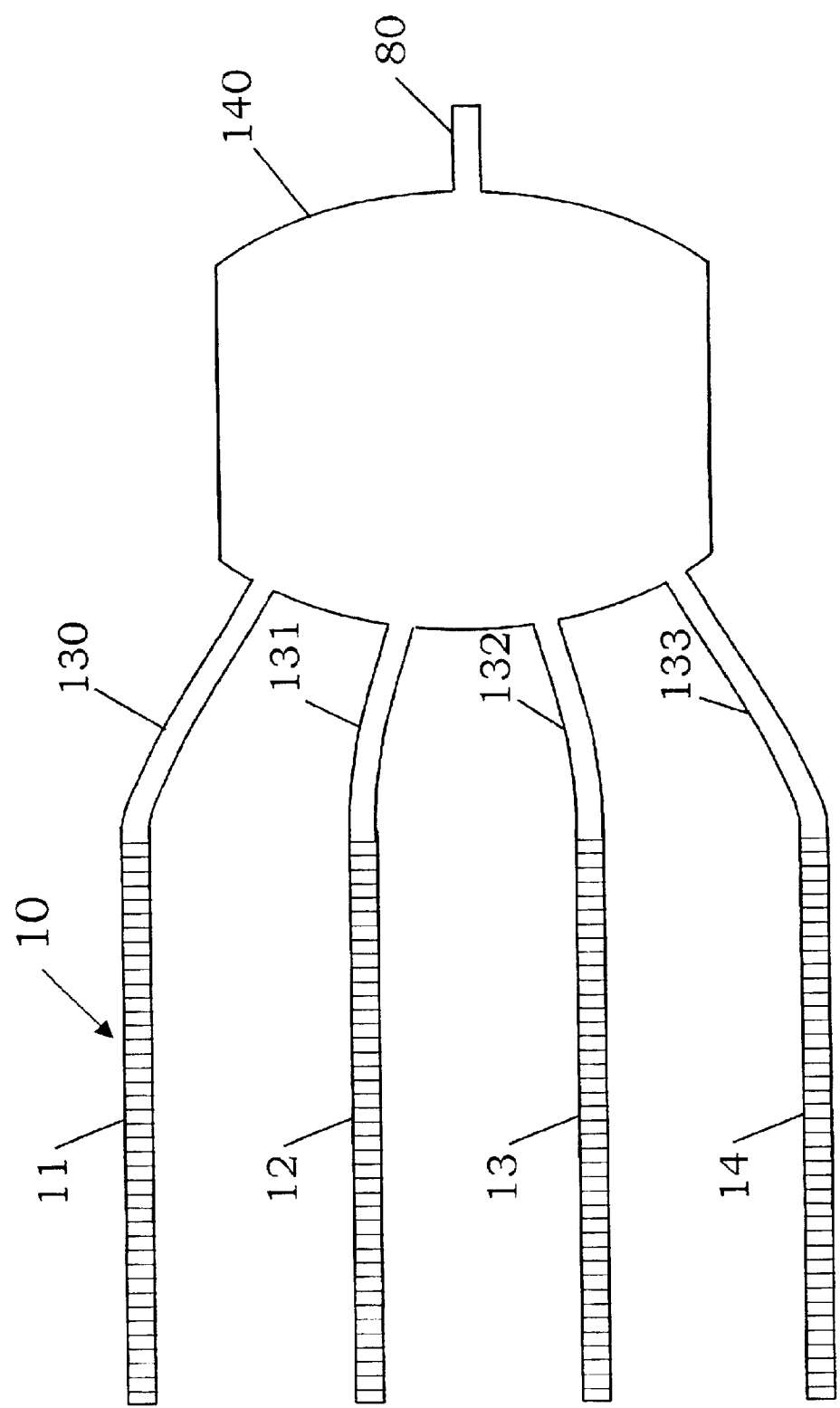
FIG. 12 is a semi-schematic representation of a sixth embodiment of a PIC of the present invention, wherein a laser array comprised of four DFB lasers uses active waveguide bends and an active star coupler to provide a combined a laser output to a SOA waveguide.

Referring now to FIG. 12, according to the present invention the individual lasers 11–14 of laser array 10 communicate light via active S-bends 130–133 to active star-coupler 140. Light from the active star coupler 140 is communicated to active SOA waveguide 80. In this manner, light from the laser array 10 is communicated to the SOA waveguide 80 using only active components, thus realizing the above discussed benefits. Separate electrodes 102 can optionally be utilized to define those portions of the active material which are to be pumped.

Figure 13:
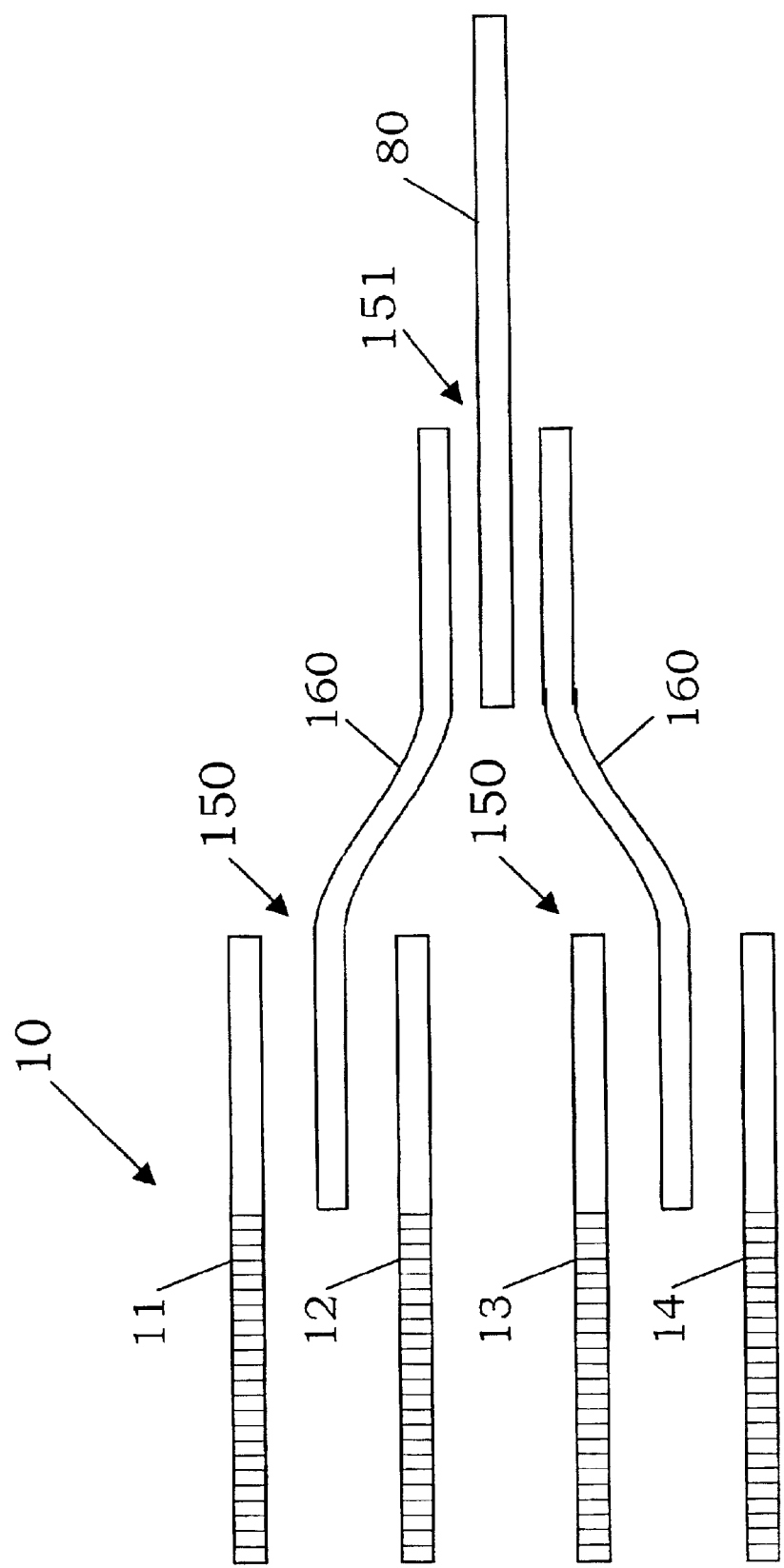
FIG. 13 is a semi-schematic representation of a seventh embodiment of a PIC of the present invention, wherein a laser array comprised of four DFB lasers uses several active directional couplers in tandem to provide a combined laser output to a SOA waveguide.

Referring now to FIG. 13, according to the present invention the plurality of separate lasers 11–14 of laser array 10 communicate light to active directional couplers 150. Light from the active directional couplers 150 is communicated via active S-bends 160 to active directional coupler 151. Light from active directional coupler 151 is communicated to SOA waveguide 80. In this manner, light from the laser array 10 is communicated to the SOA waveguide 80 using only active components, thus realizing the above discussed benefits.

Figure 14:
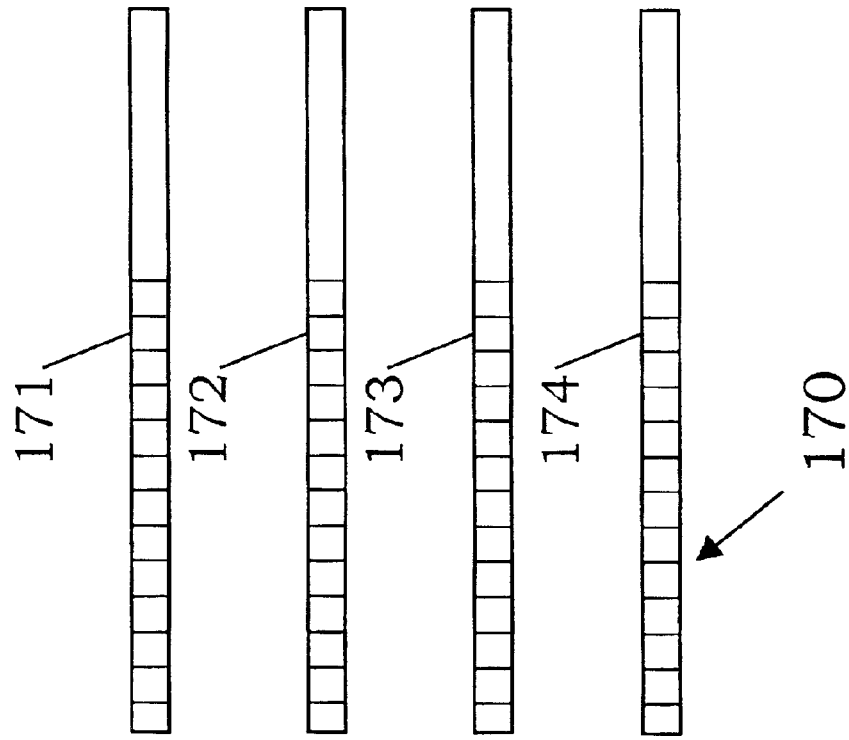
FIG. 14 is a semi-schematic representation of a laser array comprised of four distributed Bragg reflector (DBR) lasers configured to provide laser output to a combiner.

Referring now to FIG. 14, rather than an array of DFB lasers, an array of DBR (distributed Bragg reflector) lasers 171–174 may alternatively be used to define a laser array 170. The DBR laser array 170 may alternatively be used in place of the DFB laser array 10 in any of the inventions discussed herein. That is, according to the present invention, DFB lasers and DBR lasers are generally interchangeable with one another.

Figure 15:
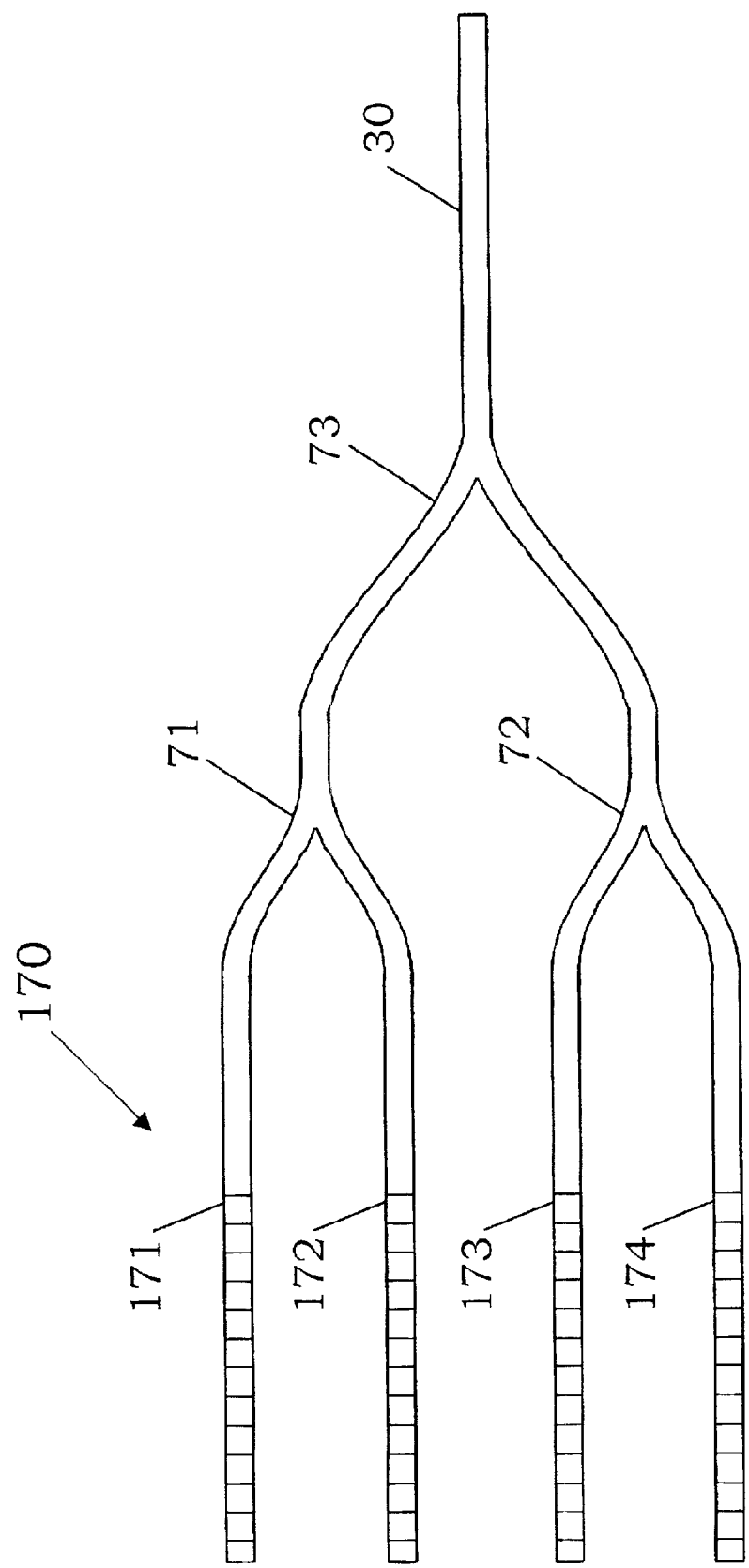
FIG. 15 is a semi-schematic representation of a four DBR laser array utilizing three passive Y-couplers as a passive power combiner to provide a composite output to a SOA waveguide according to contemporary practice.

Referring now to FIG. 15, for example, according to both contemporary practice and according to the present invention, the DFB lasers 11–14 of FIG. 5 may be replaced with DBR lasers 171–174 to form DBR laser array 170.

Figure 16:
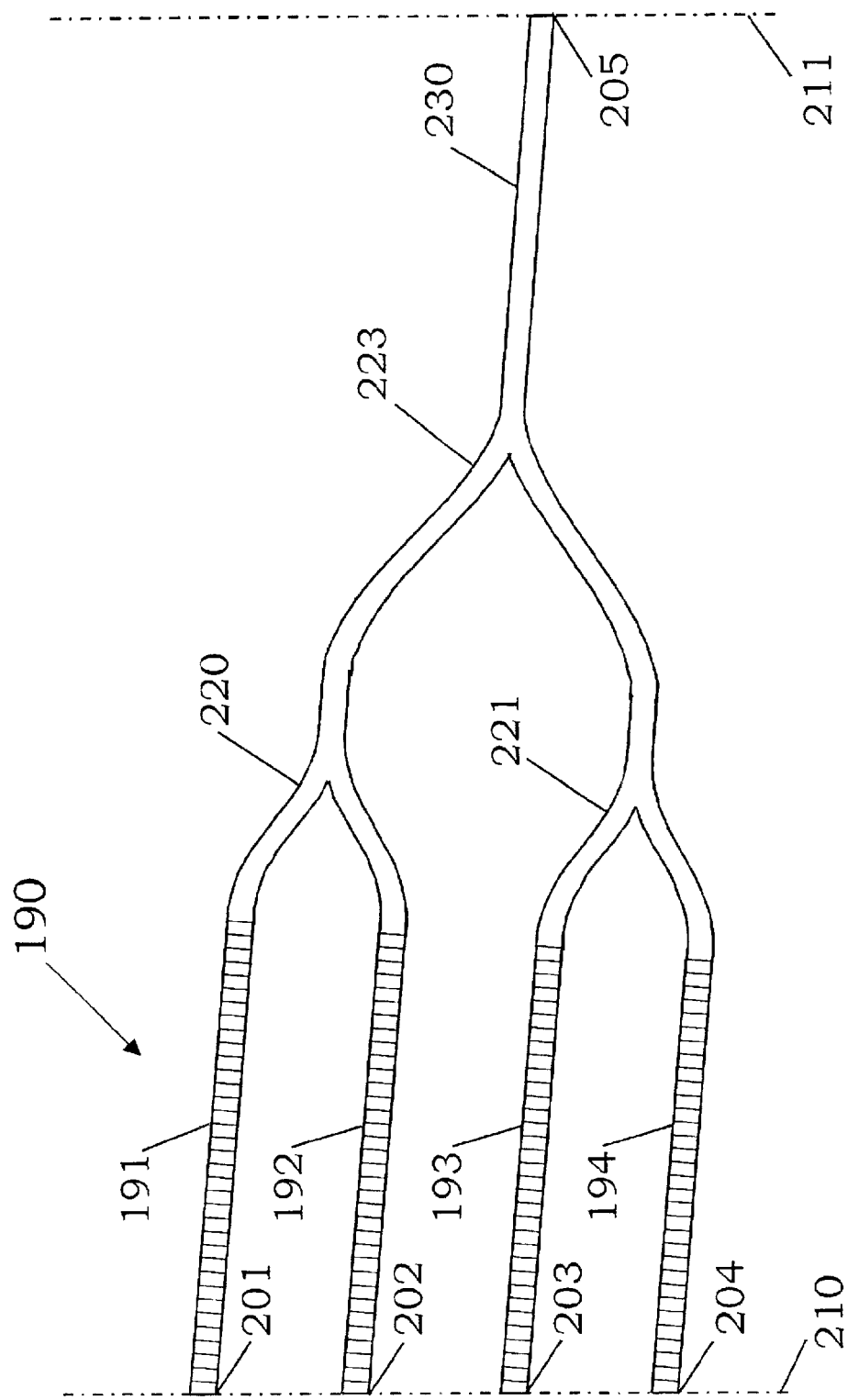
FIG. 16 semi-schematic representation of a PIC, wherein the complete PIC is rotated relative to the crystal plane in order to provide tilted facets which mitigate undesirable reflections according to the present invention.

Referring now to FIG. 16, according to the present invention, at least some portion of the photonic integrated circuit, preferably all of the photonic integrated circuit, is rotated or tilted such that at least the SOA waveguide 230, preferably both the SOA waveguide 230 and the separate lasers 191–194 of the laser array 190 (which may be either DFB or DBR lasers), form a non-orthogonal angle with respect to the cleavage 210 and 211 of the crystal plane. Thus, the separate lasers 191–194 preferably have tilted facets 201–204. Similarly, the SOA waveguide 230 preferably has a tilted facet 205.

As those skilled in the art will appreciate, such tilted facets mitigate undesirable reflections and back coupling of light in the reverse direction. That is, tilted facets 201–204 tend to mitigate undesirable reflections of light from the cleavage 210 back through the lasers 191–194. Similarly, tilted facet 205 tends to mitigate undesirable reflections of light from the cleavage 211 back into the SOA waveguide 230, and potentially, through the Y-couplers 220–223, back to the lasers 191–194. The Y-couplers 220–221 and 223 function as discussed above.

As those skilled in the art will further appreciate, such undesirable reflections may interfere with proper functioning of the lasers 191–194 and/or have other undesirable results.

Figure 17:
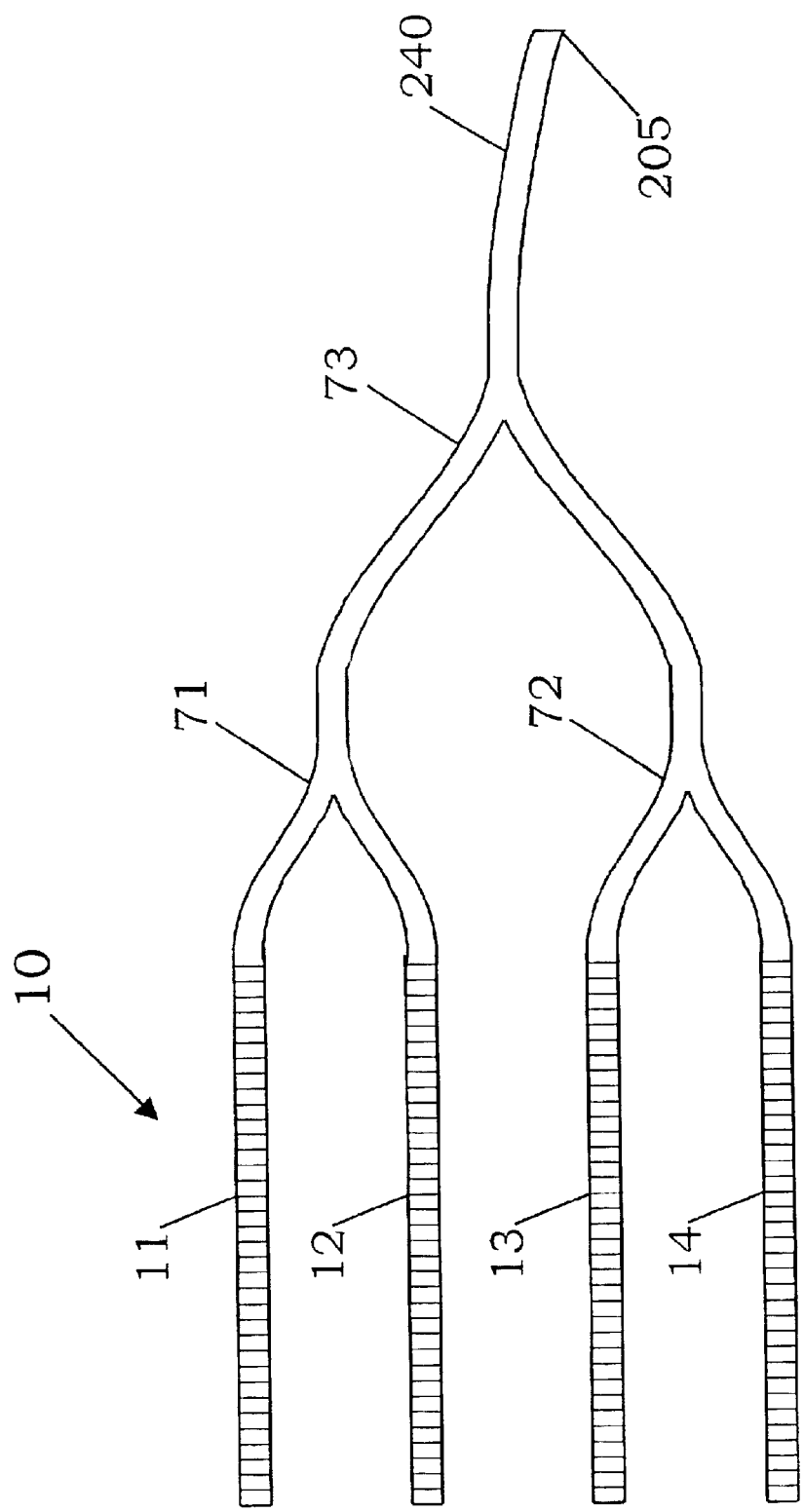
FIG. 17 is a semi-schematic representation of the PIC, wherein the final SOA waveguide is bent relative to the cleavage so as to provide a tiled facet which mitigates undesirable reflections according to the present invention.

Referring now to FIG. 17, according to the present invention, a photonic integrated circuit, such as a photonic integrated circuit comprising separate DFB lasers 11–14 which define a laser array 10 and which comprises Y-couplers 71–73, provides combined light to a curved or bent active SOA waveguide 240, so as to provide a tilted facet 205 which has low reflectivity, and therefore which mitigates undesirable reflections.

Figures 18, 19:
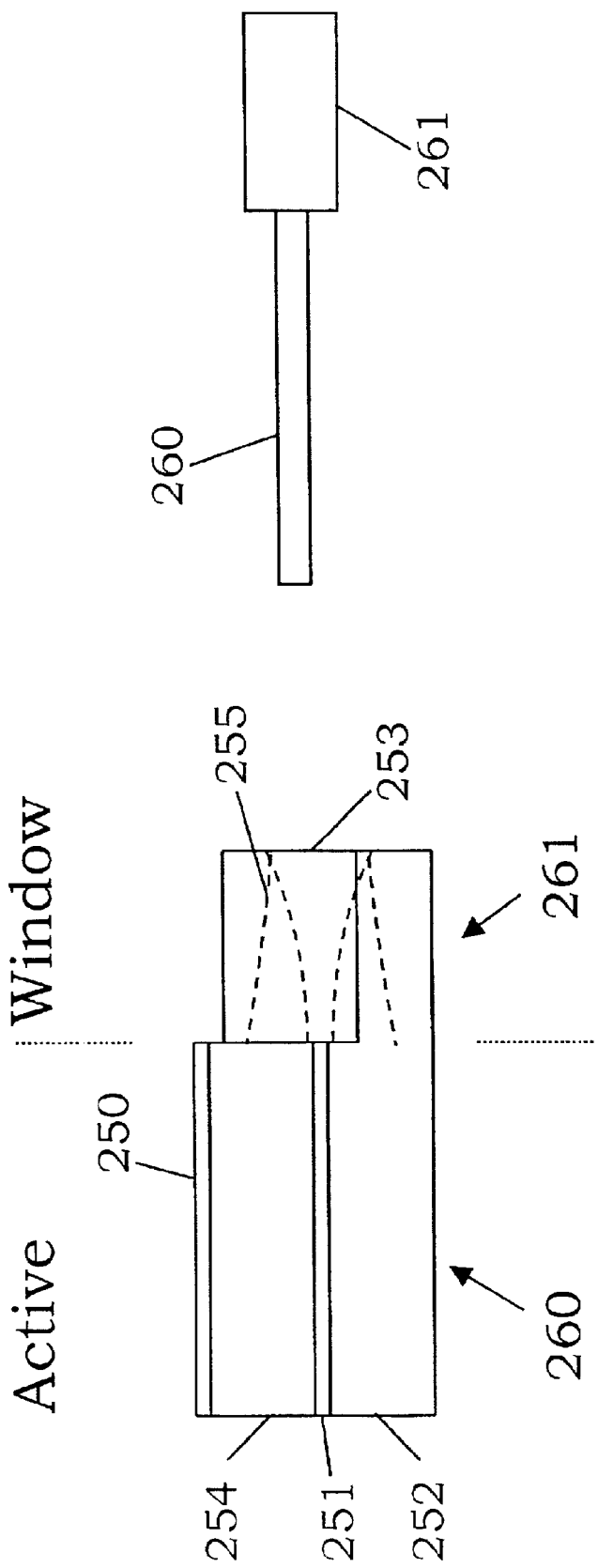
FIG. 18 is a semi-schematic cross-sectional view of an interface between an active region and a window region (bulk material), showing the laser beam shape in the window region according to the present invention.
FIG. 19 is a semi-schematic top view of the interface between an active region and a window region shown in FIG. 18.

Referring now to FIGS. 18 and 19, a window 261 is optionally formed at an end of the SOA waveguide 260. The window 261 is used for reducing the light reflected back into the waveguide. The window 261 is preferably formed in the substrate 252 and is preferably formed of the same material as the substrate, such as via overgrowth. Thus, for example, the substrate 252 may comprise InP (indium phosphate) and the material 253 of the window may also comprise an overgrowth of InP.

Since the material 253 of the window 261 is formed beyond the active region of the SOA waveguide 260, the window is likewise formed past the end of the contact 250.

Layer 251 defines the active region. The layers 252 and 254 on either side of the active region 251 typically comprise InP and define a waveguide for light generated within the active region 251. Light 255 transmitted from the active region 251 inherently diverges, such as due to the effects of defraction. Thus, the diameter of the light beam increases as the light propagates away from the active region 251. As the light propagates through the window material 253, which comprises only a single material and is therefore considered as a non-waveguide, the beam expands until it finally reaches the facet, where some of the light is transmitted through the window, while some of the light is reflected backwards. The reflected light, now propagating backwards through the window, continues to expand. When the backwardly reflected light reaches the waveguide defined by layers 251, 252 and 254, the area of the beam is much larger, as compared to the area of the beam which previously exited the active region 260. Since the reflected beam has a much larger diameter, only a fraction of the reflected beam is transmitted back into the waveguide of the active region. Thus, undesirable coupling of the reflected beam back into the waveguide is substantially mitigated.

It is important to appreciate that all of the previous embodiments or configurations of the present invention may utilize such a window.

For high power applications, the use of a window also reduces the so called "catastrophic optical degradation" which sometimes occurs at the facet (InP/air interface). Catastrophic optical degradation is mitigated due to the reduced power density resulting from the larger area of the beam.

Figure 20:
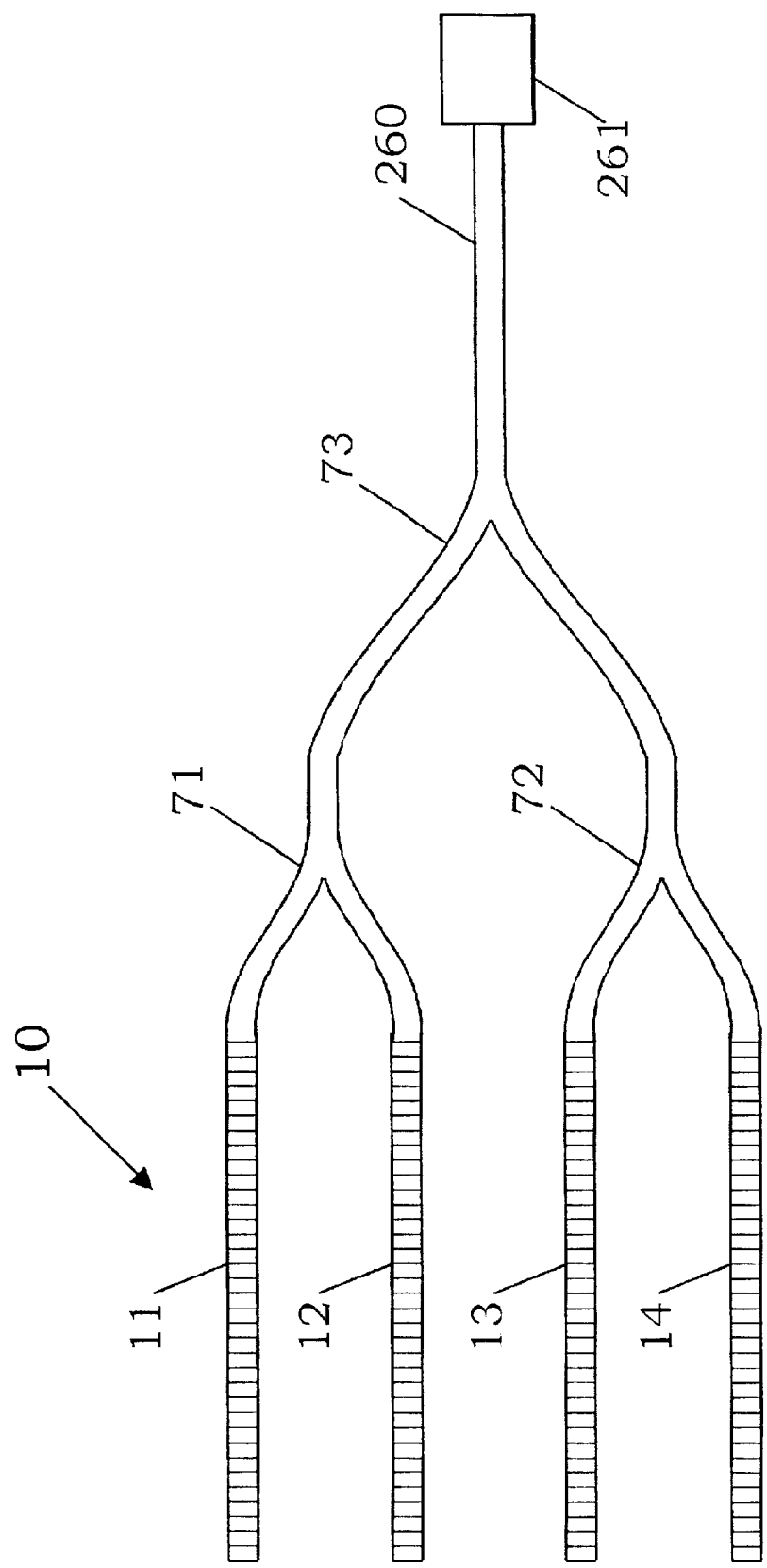
FIG. 20 is a semi-schematic representation of a PIC, wherein after the final SOA waveguide a window mitigates undesirable reflections according to the present invention.

With particular reference to FIG. 20, use of a window 261 with a DFB laser array 10 consisting of the individual lasers 11–14, such as that of FIG. 5, is shown. The window 261 facilitates low reflection coupling of the photonic integrated circuit to a fiber optic communication system, for example. Y-couplers 71, 72 and 73 function as discussed above.

Figure 21:
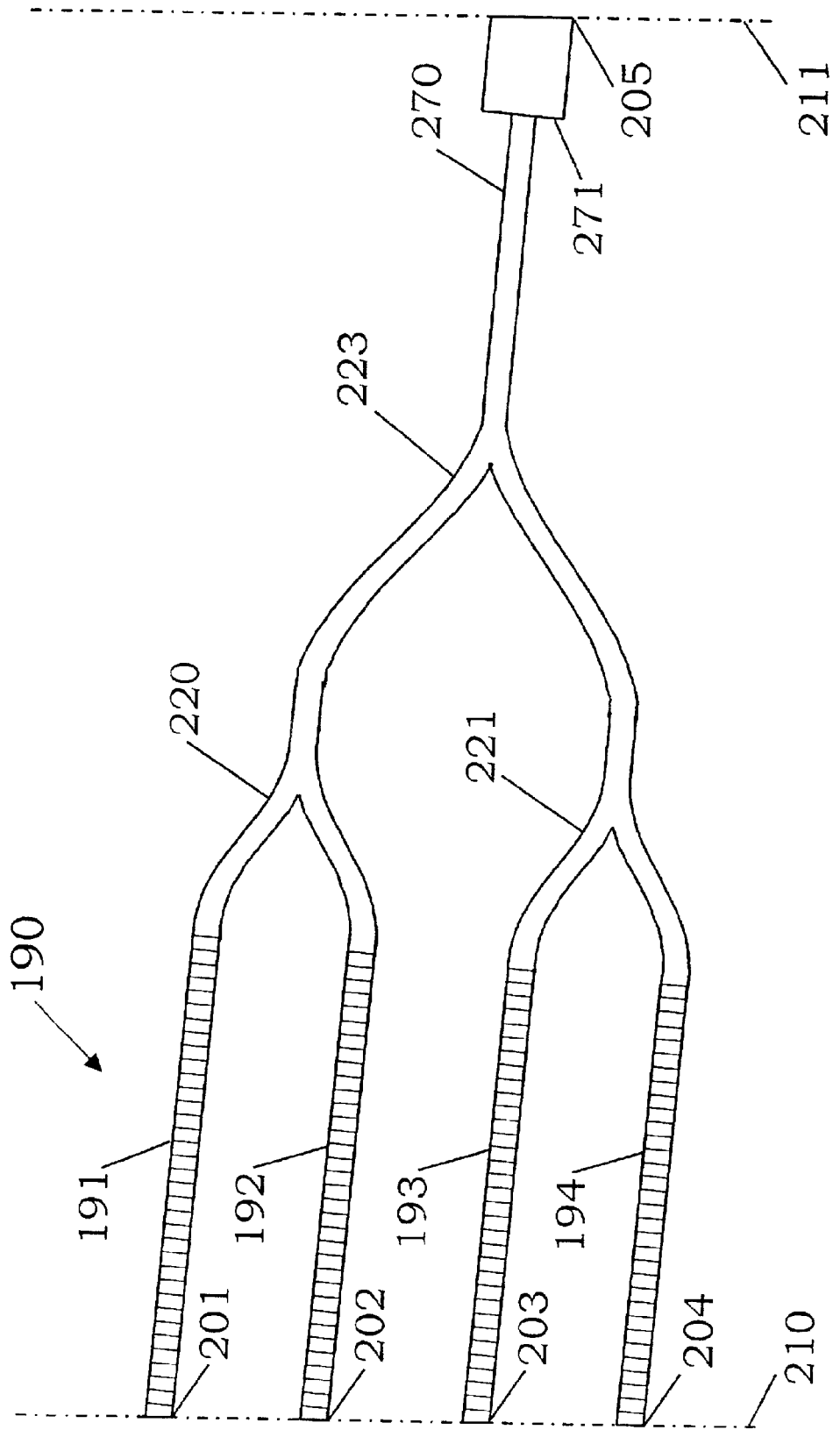
FIG. 21 is a semi-schematic representation of a PIC, wherein the PIC is rotated and has a window formed after the SOA waveguide so as to mitigate undesirable reflections according to the present invention.

With specific reference to FIG. 21, a window 271 may similarly be utilized with an array 190 of DBR lasers 191–194 and may be used when the photonic integrated circuit is tilted with respect to the cleavages 210 and 211, such as in FIG. 16. Thus, any desired combination of having or not having a window and tilting or not tilting the photonic integrated circuit with respect to the cleavages, may be utilized.

Angled facets 201, 202, 203 and 204 are formed where the lasers 191, 192, 193 and 194 meet the cleavage 210. Similarly, angle facet 205 is formed where the window 271 meets the cleavage 211. Y-couplers 220, 221 and 223 function as discussed above.

Figure 22:
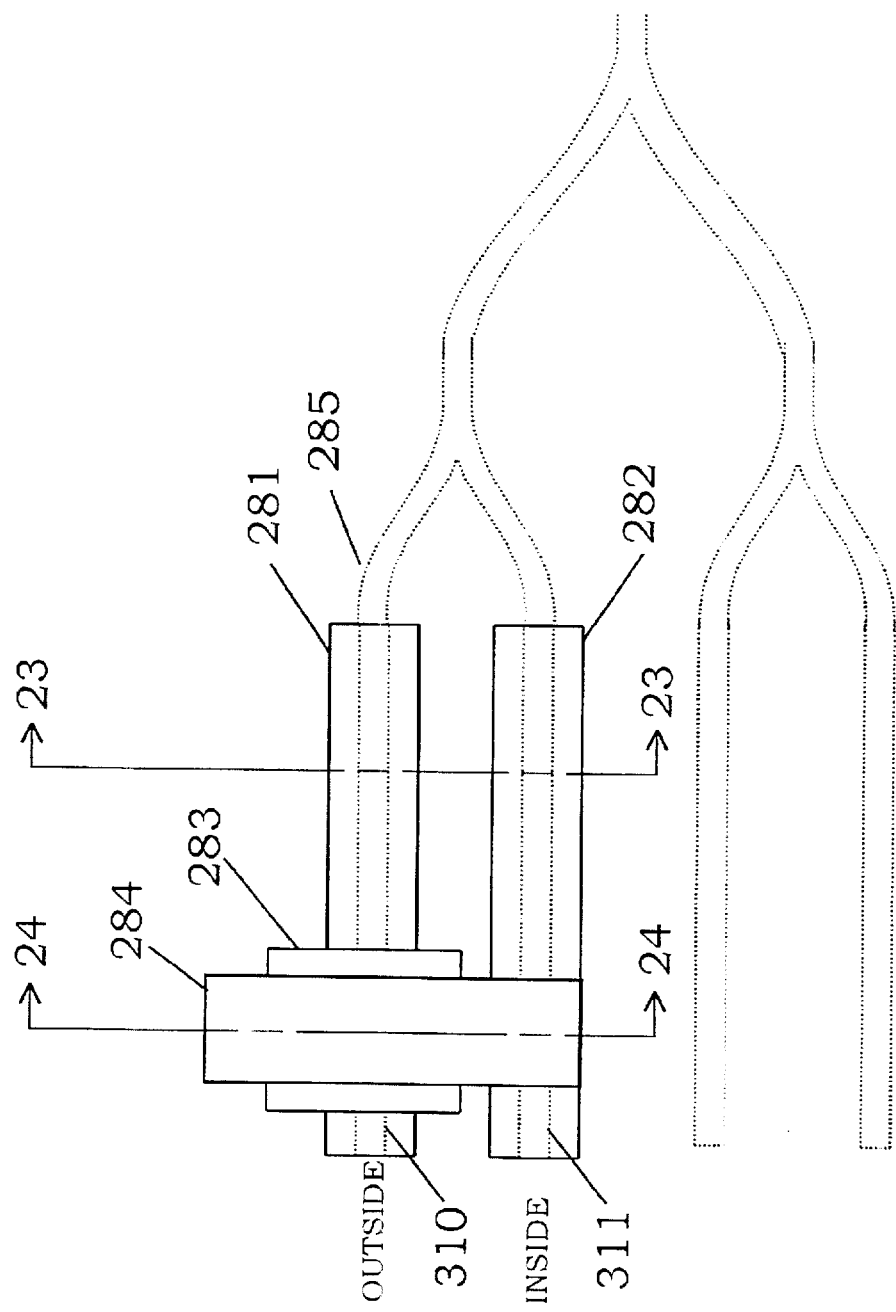
FIG. 22 is a semi-schematic top view showing two narrowly spaced lasers formed as a part of a laser array, wherein the inside laser has metal formed on top of an insulator, so as to provide desired electrical contact to the outside laser according to the present invention.
Figure 23:
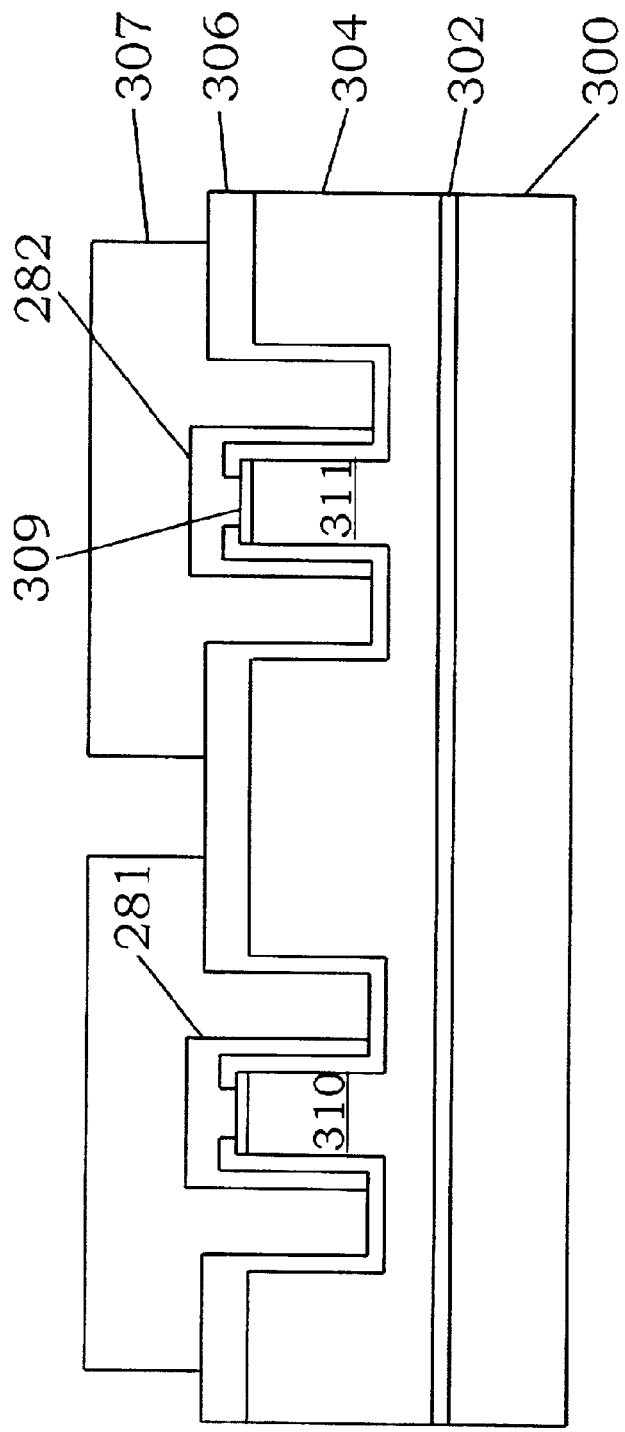
FIG. 23 is a semi-schematic cross-sectional view showing two narrowly spaced lasers which are electrically insulated from another taken along line 23 of FIG. 22.
Figure 24:
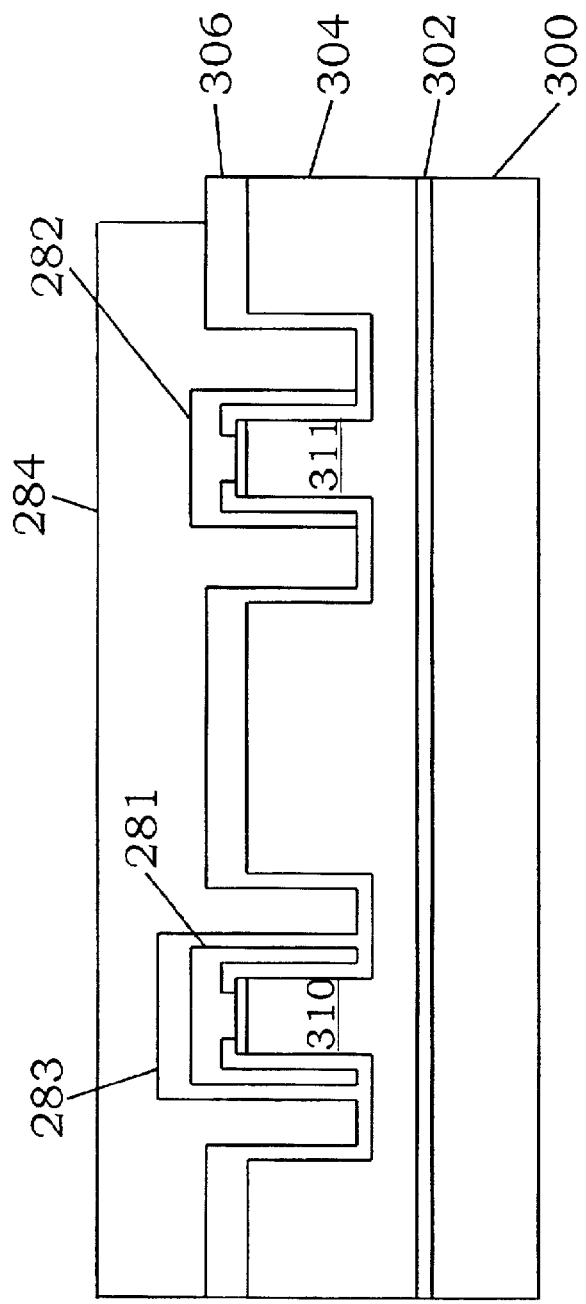
FIG. 24 is a semi-schematic cross-sectional view showing a bridge of two narrowly spaced lasers, wherein the contact of the inner laser extends above an outer laser and wherein an insulation layer provides electrical separation for the inner and outer lasers taken along lines 24 of FIG. 22.

Referring now to FIGS. 22–24, the electrical connection of lasers in a laser array, wherein the spacing between adjacent lasers is very small, e.g., generally less than 20 μm, is illustrated. According to contemporary practice, the spacing between adjacent lasers is comparatively large, e.g., generally greater than 50 μm. Thus, according to contemporary practice, sufficient surface area is provided to allow each of the lasers of such a laser array to be electrically connected to a pumping current source via bonding pads. Spacing between adjacent lasers is reduced in order to make the design compact, small, and to save some cost. Also, smaller areas require less pumping current. However, such a compact array inherently suffers from the problem that no space for pads is provided. According to the present invention, the narrow spacing is an option for further size reduction.

With particular reference to FIG. 22, according to the present invention of the all active PIC 285, pumping current is provided via the use of a bridge 284 which provides electrical connection to a selected laser (such as inside laser 311), while being electrically insulated from all other, non-selected, lasers (such as outside laser 310). The two adjacent lasers 310 and 311 are too narrowly spaced apart from one another to facilitate the use of bonding pads. In this manner, a compact laser array can be formed such that only a selected laser is activated in order to provide a desired wavelength output from the laser array.

Thus, a further metal layer defines the bridge 284 which passes over the outside laser metallization 281 without providing electrical connection thereto and which electrically connects to the inside laser metallization 282. Electrical insulation of the metal layer 284 with respect to the outside laser metallization 281 is provided by insulation layer 283, which is formed of a substantially insulating material.

All of the elements and layers of FIGS. 22–24 can be formed utilizing conventional integrated circuit and semiconductor laser fabrication techniques.

With particular reference to FIGS. 23 and 24, the layers of the narrowly spaced lasers are defined as follows: Layer 300 is the InP substrate, layer 302 is the active region of the laser, layer 304 is InP, layer 306 is an insulation layer, layer 307 is plated gold and has to be sufficiently thick to provide low resistance and good heat precipitation, layer 281 is the metallization of the outside laser, layer 282 is the metallization of the inside laser, layer 309 is contact metal which was also used as an etching mask, item 310 is an outside laser, item 311 is an inside laser, layer 283 is insulation and layer 284 is the bridge.

Preferably, the thick metal 307 is formed via a plating process.

Preferably, each laser of a laser array of the present invention has a different, preferably continuous, range of output wavelengths. Alternatively, two or more of the lasers of a laser array of the present invention may have similar or identical ranges of wavelengths, such as to provide redundancy. Such redundancy may be useful to overcome yield problems in laser device fabrication. Indeed, all of the lasers of a laser array of the present invention may have the same range of output wavelengths, if desired. Thus, the lasers of the laser array of the present invention may have any desired combination of ranges of output wavelengths.

According to contemporary practices, the complete device, i.e., laser array, is heated from the outside via the mount using a heater located close to the mount. Such heating is very slow. According to the present inventions, resistive heating elements for heating the lasers are placed as close as possible to the lasers. Preferably, the resistors are located on top of the lasers separated only by an insulation layer from the main laser electrical contact (pumping electrode).

Preferably, each laser has its own separate heater (resistive heating element) and the lasers are not necessarily heated simultaneously. That is, the lasers are preferably heated individually. By heating only a small area which is close to the selected laser, the temperature change can be accomplished substantially faster. Since the resistor requires two connections (input and output), one way to simplify the construction is to use one common electrode (a common ground, in effect) for all the inputs. Optionally, separate connections to all of the individual inputs and outputs can be provided.

Figure 25:
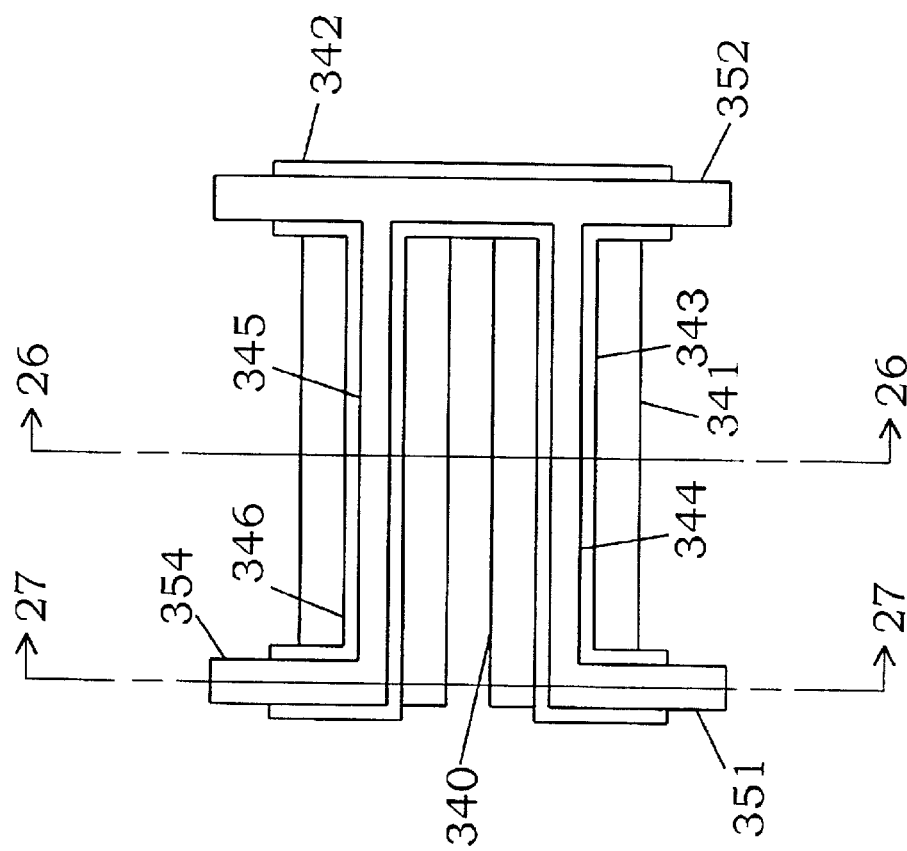
FIG. 25 is a semi-schematic top view showing a heater formed atop two lasers which are part of a laser array according to the present invention.
Figure 26:
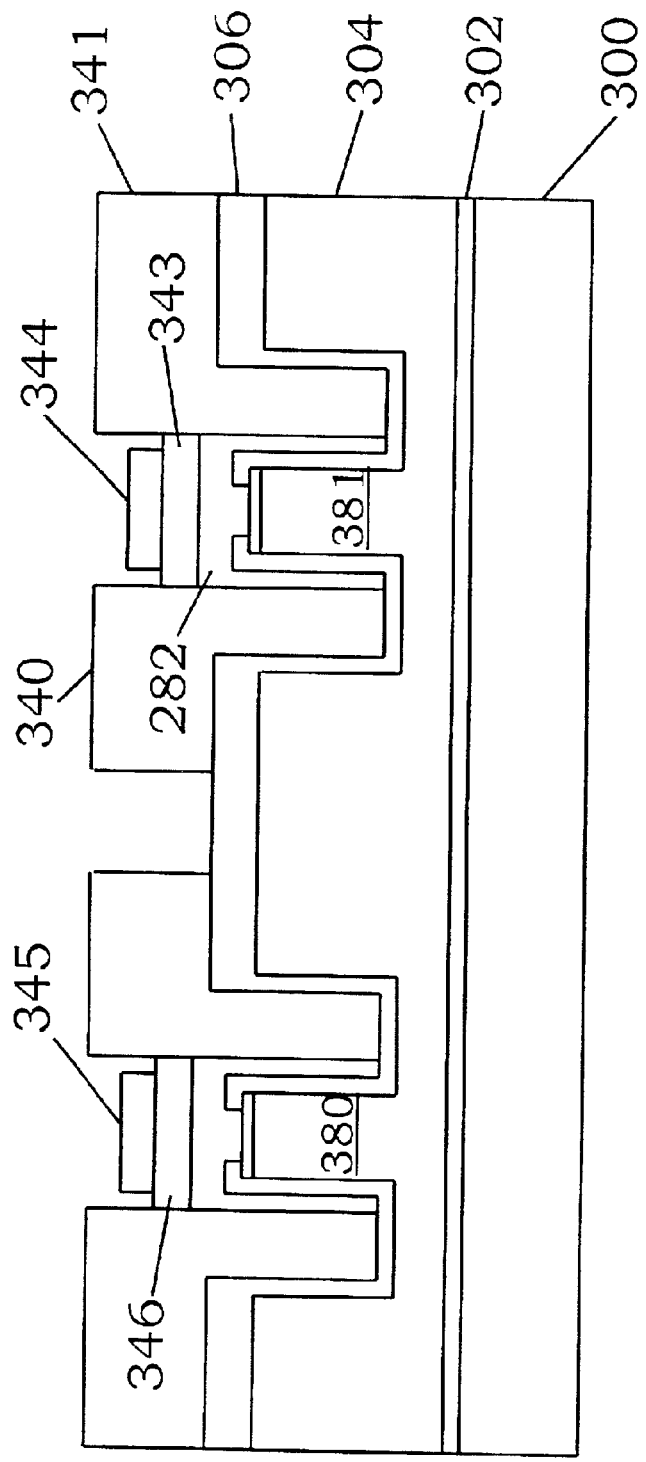
FIG. 26 is a semi-schematic cross-sectional view taken along line 26 of FIG. 25, showing the inner and outer lasers and the heaters thereof.
Figure 27:
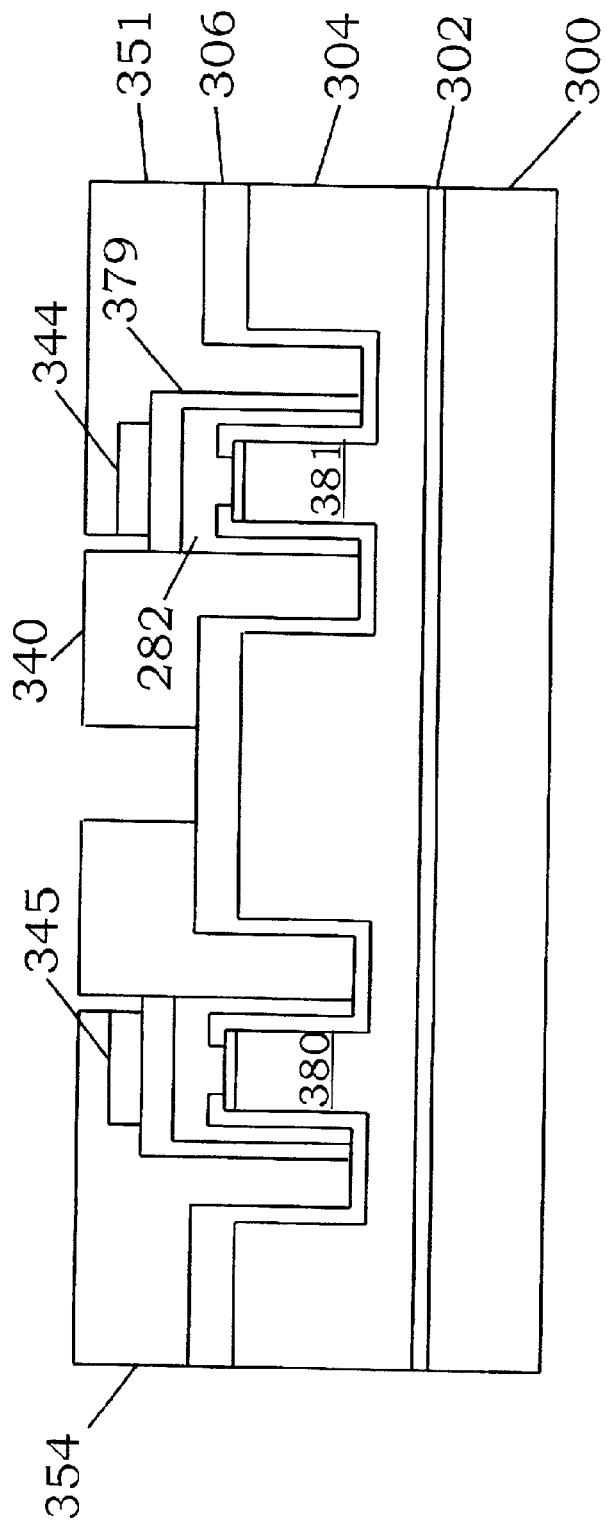
FIG. 27 is a semi-schematic cross-sectional view taken along line 27 of FIG. 25, taken at a location of heater contact.

Referring now to FIGS. 25–27, according to one aspect of the present invention, heaters 344, 345 are optionally formed on top of each lasers 380, 381 (shown in FIGS. 26 and 27) of a laser array, so as provide a closely located heat sources with respect to the lasers, in order to facilitate rapid heating of the laser in order to rapidly vary or switch the wavelength thereof. Preferably, a separate heater is formed on top of each individual laser.

Connector 351 for the heater 344 facilitates changing of the wavelength of the laser 381. The thick plated Gold of the connector 341 and 340 at the side of the laser 381 is electrically insulated from the heater, 344 via insulator, 343.

In a similar fashion, connector 354 provides electrical connection to heater 345, which facilitates changing the wavelength of laser 380. Insulator 346 electrically insulates the heater 345 from the laser 380. Common connector 352 provides a ground or common connection for all of the heaters. Insulation 342 electrically insulates the common connector 352 from the lasers.

Alternatively, instead of the common connection 352, separate connectors can be used. The common connector requires, in principle, only one bonding pad. However, by using two separate bonding pads the reliability may be increased (by eliminating reliance on the common connector). If the common connector is broken, none of the heaters connected thereto will work.

Particular reference to FIG. 26, a cross-sectional view taken along line 26 of FIG. 25, shows the inner and outer lasers and the heaters thereof.

With particular reference to FIG. 27, a cross-sectional view taken along line 27 of FIG. 25, is taken at the location of the heater contact.

With particular reference to FIGS. 26 and 27, the layers of the lasers are defined as follows: Layer 300 is the InP substrate, layer 302 is the active region of the laser, layer 304 is InP, layer 306 is an insulation layer, layer 340 and 341 is plated gold and has to be sufficiently thick to provide low resistance and good heat precipitation, layer 282 is the metallization, items 380 and 381 are the lasers, and layer 379 is an insulation.

It is understood that the exemplary PIC described herein and shown in the drawings represents only presently preferred embodiments of the invention. Indeed, various modifications and additions can be made to such embodiment without departing from the spirit and scope of the invention. For example, those skilled in the art will appreciate that various semiconductor materials may be used for the waveguides. Instead of an MMI coupler or Y-couplers, other types of couplers such as star coupler or directional couplers could alternatively be utilized. Thus, the coupler 100 shown generically in FIG. 6 may, for example, alternatively comprise a star coupler or a directional coupler. Similarly, various materials may be utilized for the substrate. Additionally, each channel of the active combiner may optionally have separate electrodes, such that the gain of each channel is independent with respect to the gain of each other channel. Thus, these and other modifications and additions may be obvious to those skilled in the art and may be implemented to adapt the present invention for use in a variety of different applications.

What is claimed is:

1. A photonic integrated circuit comprising:
   a laser array comprising a plurality of lasers, each laser having a range of wavelengths;
   multi-channel active waveguide coupler, each channel receiving an output of a particular one of the plurality of lasers of the laser array; and
   the laser and active waveguide coupler formed in a semiconductor lattice material including a substantially uniform and continuous active region, the laser and active waveguide coupler formed in the semiconductor material at an orientation which is non-orthogonal with respect to a cleavage plane of the material; and
   wherein the active waveguide coupler facilitates high output power combining of the outputs of the laser array to a single waveguide.

2. The photonic integrated circuit as recited in claim 1, wherein the laser array comprises a plurality of DFB lasers.

3. The photonic integrated circuit as recited in claim 1, wherein the laser array comprises a plurality of DBR lasers.

4. The photonic integrated circuit as recited in claim 1, wherein the laser array comprises a wavelength selectable laser array.

5. The photonic integrated circuit as recited in claim 1, wherein the laser array comprises a plurality of lasers and each laser is configured to provide an output having a different range of wavelengths.

6. The photonic integrated circuit as recited in claim 1, wherein the laser array comprises a plurality of lasers and the lasers are configured to provide outputs having overlapping ranges of wavelengths.

7. The photonic integrated circuit as recited in claim 1, wherein the laser array comprises a plurality of lasers and each laser is configured to provide an output having the same range of wavelengths.

8. The photonic integrated circuit as recited in claim 1, wherein the laser array comprises a monolithic laser array.

9. The photonic integrated circuit as recited in claim 1, wherein the laser array comprises a monolithic laser array comprising a plurality of laser diodes, each laser diode having a pre-determined range of tunable wavelengths.

10. The photonic integrated circuit as recited in claim 1, wherein the active waveguide coupler comprises at least one Y-coupler.

11. The photonic integrated circuit as recited in claim 1, wherein the active waveguide coupler comprises an MMI coupler.

12. The photonic integrated circuit as recited in claim 1, wherein the active waveguide coupler comprises at least one directional coupler.

13. The photonic integrated circuit as recited in claim 1, wherein the active waveguide coupler comprises a star coupler.

14. The photonic integrated circuit as recited in claim 1, further comprising a semiconductor optical amplifier waveguide receiving outputs of the active waveguide coupler.

15. The photonic integrated circuit as recited in claim 1, wherein light from the laser array does not pass through any substantial passive material prior to exiting the coupler.

16. The photonic integrated circuit as recited in claim 1, further comprising:
   an SOA waveguide receiving an output of the active waveguide coupler; and
   wherein light from the laser array does not pass through any substantial passive material prior to exiting the semiconductor optical amplifier waveguide.

17. The photonic integrated circuit as recited in claim 1, further comprising:
   a semiconductor optical amplifier waveguide receiving an output of the active waveguide coupler; and
   wherein the laser array, the coupler and the semiconductor optical amplifier comprise active material.

18. The photonic integrated circuit as recited in claim 1, wherein the laser array and the coupler are formed using substantially the same vertical structures.

19. The photonic integrated circuit as recited in claim 1, further comprising:
   a semiconductor optical amplifier waveguide receiving an output of the active waveguide coupler; and
   wherein the laser array, the coupler and the semiconductor optical amplifier are formed from substantially the same vertical structures.

20. The photonic integrated circuit as recited in claim 19, wherein the coupler has a gain of less than 3 dB for each two channels, and the semiconductor optical amplifier has a gain, so as to mitigate inherent losses.

21. The photonic integrated circuit as recited in claim 1, wherein a gain of the laser array and a gain of the active coupler are selectably different.

22. The photonic integrated circuit as recited in claim 1, wherein the laser array and the active coupler use separate electrodes, such that a gain of the lasers of the laser array is independent of a gain of the coupler.

23. The photonic integrated circuit as recited in claim 1, wherein each laser of the laser array uses separate electrodes to define a gain thereof, such that each laser of the laser array has a gain, which is independent-of a gain of other lasers in the laser array.

24. The photonic integrated circuit as recited in claim 1, wherein the coupler and each laser of the laser array use separate electrodes, such that a gain of the coupler and a gain of each laser of the laser array are independent with respect to one another.

25. The photonic integrated circuit as recited in claim 1, wherein each channel of the active waveguide coupler has separate electrodes, such that the gains of each channel are independent with respect to one another.

26. The photonic integrated circuit as recited in claim 1, wherein the coupler has a gain of at least 3 dB for each two channels, so as to mitigate inherent losses caused thereby.

27. The photonic integrated circuit as recited in claim 1, wherein the coupler has a gain of greater than 3 dB for each two channels, so as to function as a semiconductor optical amplifier.

28. The photonic integrated circuit as recited in claim 1, wherein electrodes are configured so as to inject current over substantially the entire coupler or selected area to reduce heat load.

29. The photonic integrated circuit as recited in claim 1, wherein electrodes are configured so as to inject current over approximately only an area of approximately maximum intensity of transmitted light in the coupler.

30. The photonic integrated circuit as recited in claim 1, further comprising a plurality of active S-bends configured to transmit light from the laser array to the active wavelength coupler.

31. The photonic integrated circuit as recited in claim 1, wherein at least one additional portion of the photonic integrated circuit is formed in semiconductor material at a non-orthogonal angle with respect to a cleavage plane of the material.

32. The photonic integrated circuit as recited in claim 1, wherein an SOA waveguide is formed in semiconductor material at a non-orthogonal angle with respect to a cleavage plane of the material.

33. The photonic integrated circuit as recited in claim 1, wherein substantially all of the photonic integrated circuit is formed in semiconductor material at a non-orthogonal angle with respect to a cleavage plane of the material.

34. The photonic integrated circuit as recited in claim 1, further comprising at least one heater element, formed above, and electrically insulated from, at least one laser of the laser array for varying or switching a wavelength thereof.

35. The photonic integrated circuit as recited in claim 1, further comprising at least one resistive heating element formed above, and electrically insulated from, at least one laser of the laser array for varying or switching a wavelength thereof.

36. A photonic integrated circuit comprising:
a monolithic laser array, the laser array comprising a plurality of laser diodes, each laser diode having a pre-determined range of tunable wavelengths;

a plurality of resistive heating elements, each resistive heating element formed in substantial proximity to an individual one of the plurality of laser diodes and each resistive heating element electrically insulated from its associated laser diode;

an active waveguide coupler configured to-power combine a plurality of outputs of the laser array; and wherein the active waveguide coupler facilitates high output power coupling of the lasers of the laser array to a single mode optical fiber.

37. A method for forming a photonic integrated circuit, the method comprising:
forming a laser array, the array including a plurality of individual laser elements:

forming an active coupler for power combining the outputs of individual ones of the laser elements of the laser array, the array and active coupler formed on a common semiconductor lattice material including a substantially uniform and continuous active region;

orienting at least the laser array at a non-orthogonal angle with respect to a cleavage plane of the semiconductor material; and wherein the laser array and the coupler are formed substantially from the same vertical semiconductor material structure.

38. The method as recited in claim 37, wherein the laser array comprises a plurality of DFB lasers.

39. The method as recited in claim 37, wherein the laser array comprises a plurality of DBR lasers.

40. The method as recited in claim 37, further comprising forming a semiconductor optical amplifier on the common semiconductor material, the amplifier receiving an output of the active waveguide coupler, the semiconductor optical amplifier being formed from substantially the same vertical semiconductor structure as the laser array and the coupler such that the array, coupler and amplifier are all formed of the same active material.

41. The method as recited in claim 37, wherein the laser array and the coupler are formed using one lithographic mask to define structures thereof.

42. The method as recited in claim 37, wherein forming a laser array comprises forming an array of wavelength selectable lasers.

43. The method as recited in claim 37, wherein forming a laser array comprises forming a plurality of lasers such that each laser is configured to provide an output having a different range of wavelengths.

44. The method as recited in claim 37, wherein forming a laser array comprises forming a plurality of lasers such that each laser is configured to provide an output having overlapping ranges of wavelengths.

45. The method is recited in claim 37, wherein forming laser array comprising forming a plurality of lasers such that each laser is configured to provide an output having the same range of wavelengths.

46. The method as recited in claim 37, wherein forming a laser array comprises forming a monolithic laser array.

47. The method as recited in claim 37, wherein forming a laser array comprises forming a monolithic laser array, the laser array comprising a plurality of laser diodes, each laser diode having a pre-determined range of tunable wavelengths.

48. The method as recited in claim 37, wherein forming a coupler comprises forming at least one Y-coupler.

49. The method as recited in claim 37, wherein forming a coupler comprises forming an MMI coupler.

50. The method as recited in claim 37, wherein forming the active waveguide coupler comprises forming at least one directional coupler.

51. The method as recited in claim 37, wherein forming the active waveguide coupler comprises forming a star coupler.

52. The method as recited in claim 37, wherein forming a laser array comprises forming a tunable laser array.

53. The method as recited in claim 37, further comprising forming a plurality of active S-bends configured to transmit light from the laser array to the coupler.

54. The method as recited in claim 37, wherein an SOA waveguide is formed at a non orthogonal angle with respect to a cleavage plane of the semiconductor material so as to mitigate reflection of light.

55. The method as recited in claim 37, wherein substantially all of the photonic integrated circuit is formed at a non-orthogonal with respect to a cleavage plane of the semiconductor material so as to mitigate reflection of light.

56. The method as recited in claim 37, further comprising forming a plurality of individual resistive heating elements, at least one heating element formed above, and electrically, insulated from, a corresponding one of the lasers of the laser array for varying or switching a wavelength thereof.

57. A photonic integrated circuit comprising:

a laser array formed in a crystalline lattice structure semiconductor material;

an active waveguide coupler receiving outputs of the laser array; and wherein at least one portion of the photonic integrated circuit is formed at a non-orthogonal angle with respect to a cleavage plane of the semiconductor material.

58. The photonic integrated circuit as recited in claim 57, wherein an SOA waveguide is formed at a non-orthogonal angle with respect to the cleavage plane of the semiconductor material.

59. The photonic integrated circuit as recited in claim 57, wherein substantially all of the photonic integrated circuit is formed at a non-orthogonal angle with respect to the cleavage plane of the semiconductor material.

60. A photonic integrated circuit comprising:

a laser array comprising a plurality of lasers formed in a crystalline lattice structure semiconductor material;

at least one heater element, the heater element formed above, and electrically insulated from, a corresponding individual one of the plurality of lasers for varying or switching a wavelength thereof;

an active waveguide coupler formed in the crystalline lattice structure semiconductor material receiving outputs of the laser array; and wherein the laser array and active waveguide coupler are oriented at a non-orthogonal angle with respect to the cleavage plane of the semiconductor material.

61. The photonic integrated circuit as recited in claim 60, wherein the heater comprises a resistive heating element.

* * * * *